(12) United States Patent
Kim et al.

(10) Patent No.:  US 12,578,816 B2
(45) **Date of Patent:  \*Mar. 17, 2026**

(54) TOUCH DETECTION MODULE AND DISPLAY DEVICE INCLUDING THE SAME

(71) Applicant: SAMSUNG DISPLAY CO., LTD., Yongin-si (KR)

(72) Inventors: Hyung Bae Kim, Yongin-si (KR); Jeon Min Kang, Yongin-si (KR)

(73) Assignee: Samsung Display Co., Ltd., Yongin-si (KR)

( \* ) Notice: Subject to any disclaimer, the term of this patent is extended or adjusted under 35 U.S.C. 154(b) by 0 days.

This patent is subject to a terminal disclaimer.

(21) Appl. No.: 18/822,065

(22) Filed: Aug. 30, 2024

(65) Prior Publication Data

US 2024/0419282 A1     Dec. 19, 2024

Related U.S. Application Data

(63) Continuation of application No. 18/348,243, filed on Jul. 6, 2023, now Pat. No. 12,079,422.

(30) Foreign Application Priority Data

Aug. 30, 2022     (KR) ......................... 10-2022-0109155

(51) Int. Cl.
*G06F 3/041*          (2006.01)
*G06F 3/044*          (2006.01)
(Continued)

(52) U.S. Cl.
CPC ........ *G06F 3/04166* (2019.05); *G06F 3/0412* (2013.01); *G06F 3/04164* (2019.05);
(Continued)

(58) Field of Classification Search
CPC .. G06F 3/04166; G06F 3/0445; G06F 3/0446; G06F 3/04164; G06F 3/0412;
(Continued)

(56) References Cited

U.S. PATENT DOCUMENTS 9,244,486 B2     1/2016  Kang et al.
12,079,422 B2 \*  9/2024  Kim ...................... G06F 3/0418
(Continued)

FOREIGN PATENT DOCUMENTS

CN          112578934 A      3/2021
CN          112578938 A      3/2021
(Continued)

OTHER PUBLICATIONS

Tung, et al., "High Optical Visibility and Shielding Effectiveness Metal Mesh Film for Microwave Oven Application," IEEE Transactions on Electromagnetic Compatibility, vol. 62 Issue: 4, Aug. 2020, 6 pages.

*Primary Examiner* — Tom V Sheng
(74) *Attorney, Agent, or Firm* — Womble Bond Dickinson (US) LLP

(57)          ABSTRACT

A touch detection module includes: first driving electrodes side by side; first detection electrodes intersecting the first driving electrodes; second driving electrodes on front surfaces of the first driving electrodes corresponding to the first driving electrodes with a touch insulating layer interposed therebetween; second detection electrodes on front surfaces of the first detection electrodes corresponding to the first detection electrodes with the touch insulating layer interposed therebetween; driving switching circuits electrically connecting the second driving electrodes to the respective first driving electrodes corresponding to each other or a low potential voltage source; detecting switching circuits electrically connecting the second detection electrodes to the respective first detection electrodes corresponding to each (Continued)

other or the low potential voltage source; and a touch driving circuit configured to supply touch driving signals to the first driving electrodes and to detect touch detection signals through the first detection electrodes to detect touch position coordinates.

15 Claims, 18 Drawing Sheets

(51) Int. Cl.
    *G06F 3/0354*         (2013.01)
    *H10K 59/40*         (2023.01)

(52) U.S. Cl.
    CPC .......... *G06F 3/0418* (2013.01); *G06F 3/0445* (2019.05); *G06F 3/0446* (2019.05); *G06F 3/03547* (2013.01); *G06F 3/0414* (2013.01); *G06F 2203/04101* (2013.01); *G06F 2203/04103* (2013.01); *G06F 2203/04111* (2013.01); *H10K 59/40* (2023.02)

(58) Field of Classification Search
    CPC ......... G06F 3/0418; G06F 2203/04101; G06F 2203/04103; G06F 2203/04111

USPC ........................................................ 345/174
See application file for complete search history.

(56)         References Cited

U.S. PATENT DOCUMENTS

| | | |
|---|---|---|
| 2010/0321327 A1 | 12/2010 | Liu |
| 2013/0201348 A1 | 8/2013 | Li et al. |
| 2016/0147339 A1 | 5/2016 | Teranishi et al. |
| 2016/0283009 A1 | 9/2016 | Sun et al. |
| 2017/0068386 A1 | 3/2017 | Lai et al. |
| 2017/0199597 A1 | 7/2017 | Son et al. |
| 2018/0359070 A1 | 12/2018 | Astrom et al. |
| 2021/0083012 A1 | 3/2021 | Byun et al. |
| 2023/0297191 A1 | 9/2023 | Lee |
| 2023/0325041 A1 | 10/2023 | Kim et al. |
| 2024/0061527 A1 | 2/2024 | Kim et al. |

FOREIGN PATENT DOCUMENTS

| | | |
|---|---|---|
| JP | 5526761 B2 | 6/2014 |
| KR | 10-0982636 B | 9/2010 |
| KR | 10-2023-0146693 A | 10/2023 |

* cited by examiner

10

210

410

DA

NDA

SBA

200

300

400

Y

X

Z

100 : DA , NDA , SBA

DU

210          SP          GL          DA    NDA

VL

DL

FOL

GCL

SBA          200

SEN1 : TE1, RE1
SEN2 : TE2. RE2

SEN1 : TE1, RE1
SEN2 : TE2, RE2

TOUCH DETECTION MODULE AND DISPLAY DEVICE INCLUDING THE SAME

CROSS-REFERENCE TO RELATED APPLICATIONS

This application is a continuation of U.S. patent application Ser. No. 18/348,243, filed Jul. 6, 2023, which claims priority to and the benefit of Korean Patent Application No. 10-2022-0109155, filed Aug. 30, 2022, the entire content of both of which is incorporated herein by reference.

BACKGROUND

1. Field

Aspects of some embodiments of the present disclosure relate to a touch detection module and a display device including the same.

2. Description of the Related Art

As the information society develops, the demand for a display device for displaying images is increasing in various forms. For example, display devices may be utilized in various electronic devices such as smartphones, digital cameras, laptop computers, navigation devices, and smart televisions.

A display device includes, for example, a flat panel display device such as a liquid crystal display device, a field emission display device, or an organic light emitting display device. Among the flat panel display devices, the light emitting display device may include a light emitting element in which each of the pixels of a display panel may emit light by itself, thereby displaying an image without a backlight unit providing the light to the display panel.

In recent years, display devices may include a touch detection module for detecting a user's touch as one of the interface means. The touch detection module includes a touch sensing unit in which touch electrodes are arranged, and a touch driving circuit for detecting a change in capacitance between the touch electrodes. The touch detection module may be mass-produced while being formed integrally with an image display unit of the display device or mounted on the image display unit.

The above information disclosed in this Background section is only for enhancement of understanding of the background and therefore the information discussed in this Background section does not necessarily constitute prior art.

SUMMARY

Aspects of some embodiments of the present disclosure may include a touch detection module capable of reducing the amount of electromagnetic interference (EMI) radiation and a display device including the same.

Aspects of some embodiments of the present disclosure may also include a touch detection module capable of reducing the amount of EMI radiation or increasing touch detection performance by selectively using first and second touch electrodes of a double layer, and a display device including the same.

However, aspects of embodiments according to the present disclosure are not restricted to those set forth herein. The above and other aspects of embodiments according to the present disclosure will become more apparent to one of ordinary skill in the art to which the present disclosure pertains by referencing the detailed description of the present disclosure given below.

According to some embodiments of the disclosure, a touch detection module comprising first driving electrodes arranged side by side, first detection electrodes intersecting the first driving electrodes, second driving electrodes arranged on front surfaces of the first driving electrodes to correspond to the first driving electrodes with a touch insulating layer interposed therebetween, second detection electrodes arranged on front surfaces of the first detection electrodes to correspond to the first detection electrodes with the touch insulating layer interposed therebetween, driving switching circuits electrically connecting the second driving electrodes to the respective first driving electrodes corresponding to each other or a low potential voltage source, detecting switching circuits electrically connecting the second detection electrodes to the respective first detection electrodes corresponding to each other or the low potential voltage source, and a touch driving circuit supplying touch driving signals to the first driving electrodes and detecting touch detection signals through the first detection electrodes to detect touch position coordinates.

According to some embodiments, the touch detection module may further include a proximity detection sensing unit including at least one sensor of at least one ultrasonic sensor, at least one infrared sensor, at least one motion detection sensor, and a light emitting and light receiving sensor, and detecting a touch input device or a body portion of a user that is close to the at least one sensor, and supplying a proximity detection signal to the touch driving circuit according to a detection result.

According to some embodiments, the driving switching circuits include first driving switching circuits electrically connecting or disconnecting the second driving electrodes to or from the respective first driving electrodes corresponding to each other in response to a first switching control signal from the touch driving circuit, and second driving switching circuits electrically connecting or disconnecting the second driving electrodes to or from the low potential voltage source in response to a second switching control signal from the touch driving circuit.

According to some embodiments, the detection switching circuits include first detection switching circuits electrically connecting or disconnecting the second detection electrodes to or from the respective first detection electrodes corresponding to each other in response to a third switching control signal from the touch driving circuit, and second detection switching circuits electrically connecting or disconnecting the second detection electrodes to or from the low potential voltage source in response to a fourth switching control signal from the touch driving circuit.

According to some embodiments, the first driving switching circuits include at least one first switching element electrically connecting or disconnecting the at least one second driving electrode to or from the at least one first driving electrode, respectively, in response to the first switching control signal input through a first switching signal line, and the second driving switching circuits include at least one second switching element electrically connecting or disconnecting the at least one second driving electrode to or from the low potential voltage source, in response to the second switching control signal input through a second switching signal line.

According to some embodiments, the first detection switching circuits include at least one third switching element electrically connecting or disconnecting the at least one second detection electrode to or from a touch detection line or the at least one first detection electrode, in response to the third switching control signal input through a third switching signal line, and the second detection switching circuits include at least one fourth switching element electrically connecting or disconnecting the at least one second detection electrode to or from the low potential voltage source, in response to the fourth switching control signal input through a fourth switching signal line.

According to some embodiments, the touch driving circuit determines a period in which the proximity detection signal is not input from the proximity detection sensing unit as a non-touch detection period in which a touch does not occur, and during the non-touch detection period, the touch driving circuit supplies a second switching control signal of a turn-on level to the second driving switching circuit and supplies a fourth switching control signal of a turn-on level to the second detection switching circuit, and supplies a first switching control signal of a turn-off level to the first driving switching circuits and supplies a third switching control signal of a turn-off level to the first detection switching circuits.

According to some embodiments, the touch driving circuit determines that the user's touch occurs when the proximity detection signal is input from the proximity detection sensing unit, and during a touch detection period, the touch driving circuit supplies a second switching control signal of a turn-off level to the second driving switching circuit and supplies a fourth switching control signal of a turn-off level to the second detection switching circuit, and supplies a first switching control signal of a turn-on level to the first driving switching circuits and supplies a third switching control signal of a turn-on level to the first detection switching circuits.

According to some embodiments, further comprising first connection electrodes electrically connecting the first driving electrodes adjacent to each other in a first axial direction, second connection electrodes electrically connecting the second driving electrodes adjacent to each other in the first axial direction, third connection electrodes electrically connecting the first detection electrodes adjacent to each other in a second axial direction intersecting the first axial direction, and fourth connection electrodes electrically connecting the second detection electrodes adjacent to each other in the second axial direction.

According to some embodiments, the first connection electrodes are formed of the same metal material as that of the second driving electrode through the same patterning process as that of the second driving electrode, and connect the first driving electrodes adjacent to each other in the first axial direction through a plurality of first and second electrode contact holes penetrating through the touch insulating layer, the second connection electrodes are formed of the same metal material as that of the first driving electrode when the first driving electrode is formed, and the second driving electrodes are electrically connected to the second connection electrodes through a plurality of third and fourth electrode contact holes penetrating through the touch insulating layer and formed on front surfaces of the second connection electrodes.

According to some embodiments, the third connection electrodes are formed of the same metal material as that of the first detection electrodes when the first detection electrodes are formed, the second detection electrodes are electrically connected to the third connection electrodes through a plurality of fifth to eighth electrode contact holes penetrating through the touch insulating layer and formed on front surfaces of the third connection electrodes, and the fourth connection electrodes are formed of the same metal material as that of the second detection electrodes through the same process as that of the second detection electrodes, and connect the first detection electrodes adjacent to each other through a plurality of ninth to twelfth electrode contact holes penetrating through the touch insulating layer.

According to some embodiments, the first driving electrodes and the first detection electrodes are formed of an opaque conductive alloy, and the second driving electrodes and the second detection electrodes are formed of a transparent metal material including indium tin oxide (ITO).

According to some embodiments, the driving switching circuits, the detection switching circuits, and the touch driving circuit are integrally integrated to form an integrated circuit, and are on a circuit film or circuit board separately from the first and second driving electrodes.

According to some embodiments, further comprising a floating electrode layer on front surfaces of the second driving electrode and the second detection electrode with at least one insulating layer interposed therebetween; and a third driving switching circuit electrically connecting or disconnecting and floating at least one planar floating electrode on the floating electrode layer to or from the low potential line to which the low potential voltage source is applied, according to a switching control signal from the touch driving circuit.

According to some embodiments of the present disclosure, a display device includes a display panel including a display area in which sub-pixels are arranged, a display driving circuit controlling driving of the display panel, a circuit board on which the display driving circuit is mounted, a proximity sensing sensor detecting a user's proximity to generate a proximity detection signal, and a touch detection module on a front surface of the display panel to detect a user's touch, wherein the touch detection module includes first driving electrodes arranged side by side, first detection electrodes intersecting the first driving electrodes, second driving electrodes arranged on front surfaces of the first driving electrodes to correspond to the first driving electrodes with a touch insulating layer interposed therebetween, second detection electrodes arranged on front surfaces of the first detection electrodes to correspond to the first detection electrodes with the touch insulating layer interposed therebetween, driving switching circuits electrically connecting the second driving electrodes to the respective first driving electrodes corresponding to each other or a low potential voltage source, detecting switching circuits electrically connecting the second detection electrodes to the respective first detection electrodes corresponding to each other or the low potential voltage source, and a touch driving circuit supplying touch driving signals to the first driving electrodes and detecting touch detection signals through the first detection electrodes to detect touch position coordinates.

According to some embodiments, the driving switching circuits include first driving switching circuits electrically connecting or disconnecting the second driving electrodes to or from the respective first driving electrodes corresponding to each other in response to a first switching control signal from the touch driving circuit, and second driving switching circuits electrically connecting or disconnecting the second driving electrodes to or from the low potential voltage source in response to a second switching control signal from the touch driving circuit.

According to some embodiments, the detection switching circuits include first detection switching circuits electrically connecting or disconnecting the second detection electrodes to or from the respective first detection electrodes corresponding to each other in response to a third switching control signal from the touch driving circuit, and second detection switching circuits electrically connecting or disconnecting the second detection electrodes to or from the low potential voltage source in response to a fourth switching control signal from the touch driving circuit.

According to some embodiments, the touch driving circuit determines a period in which the proximity detection signal is not input from the proximity detection sensing unit as a non-touch detection period in which a touch does not occur, and during the non-touch detection period, the touch driving circuit supplies a second switching control signal of a turn-on level to the second driving switching circuit and supplies a fourth switching control signal of a turn-on level to the second detection switching circuit, and supplies a first switching control signal of a turn-off level to the first driving switching circuits and supplies a third switching control signal of a turn-off level to the first detection switching circuits.

According to some embodiments, the touch driving circuit determines that the user's touch occurs when the proximity detection signal is input from the proximity detection sensing unit, and during a touch detection period, the touch driving circuit supplies a second switching control signal of a turn-off level to the second driving switching circuit and supplies a fourth switching control signal of a turn-off level to the second detection switching circuit, and supplies a first switching control signal of a turn-on level to the first driving switching circuits and supplies a third switching control signal of a turn-on level to the first detection switching circuits.

According to some embodiments, the driving switching circuits, the detection switching circuits, and the touch driving circuit are integrally integrated to form an integrated circuit, and are on a circuit film or circuit board separately from the first and second driving electrodes.

The touch detection module and the display device according to some embodiments of the present disclosure may reduce the amount of EMI radiation by using the first and second electrodes of the double layer.

Further, the touch detection module and the display device according to some embodiments of the present disclosure may reduce the amount of EMI radiation or increase the touch detection performance by selectively using the first and second electrodes of the double layer.

However, the characteristics of embodiments according to the present disclosure are not restricted to the one set forth herein. The above and other characteristics of some embodiments will become more apparent to one of daily skill in the art to which the embodiments pertain by referencing the claims.

BRIEF DESCRIPTION OF THE DRAWINGS

The above and other aspects and characteristics of some embodiments of the present disclosure will become more apparent by describing in more detail aspects of some embodiments thereof with reference to the attached drawings, in which.

DETAILED DESCRIPTION

Aspects of some embodiments of the present invention will now be described more fully hereinafter with reference to the accompanying drawings, in which aspects of some embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Each of the features of the various embodiments of the present disclosure may be combined or combined with each other, in part or in whole, and technically various interlocking and driving are possible. The embodiments may be implemented independently of each other or may be implemented together in an association.

Hereinafter, specific embodiments will be described with reference to the accompanying drawings.

Figure 1:
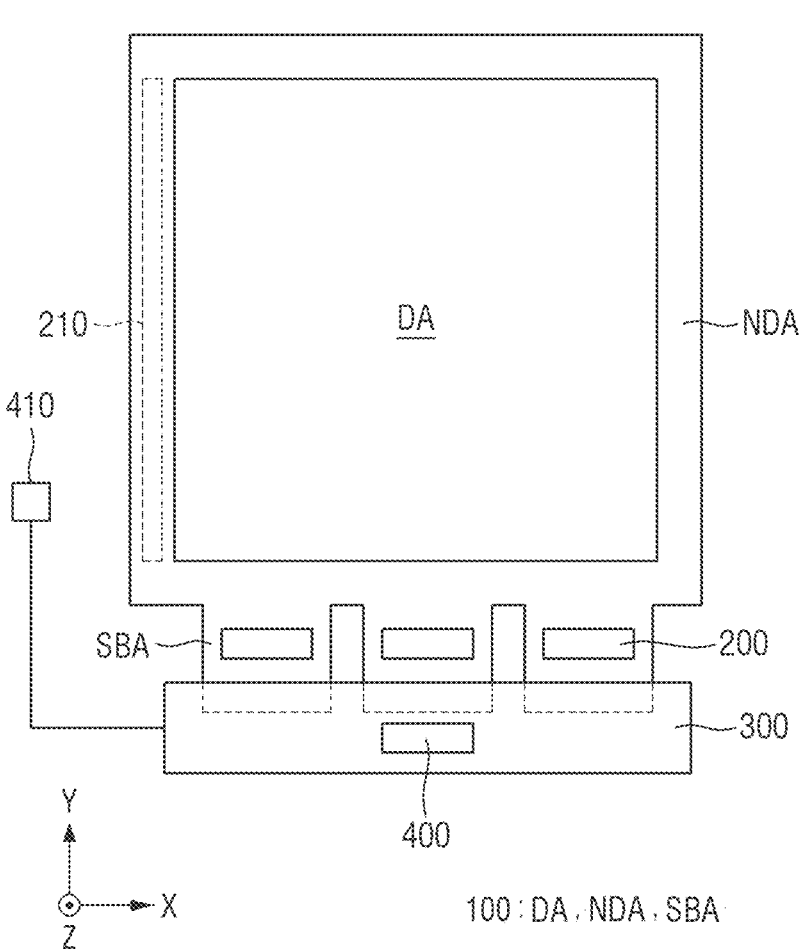
FIG. 1 is a plan view illustrating a configuration of a display device according to some embodiments of the present disclosure.

FIG. 1 is a plan view illustrating a configuration of a display device according to some embodiments of the present disclosure. In addition, FIG. 2 is a side cross-sectional view illustrating the display device of FIG. 1 in more detail.

Figure 2:
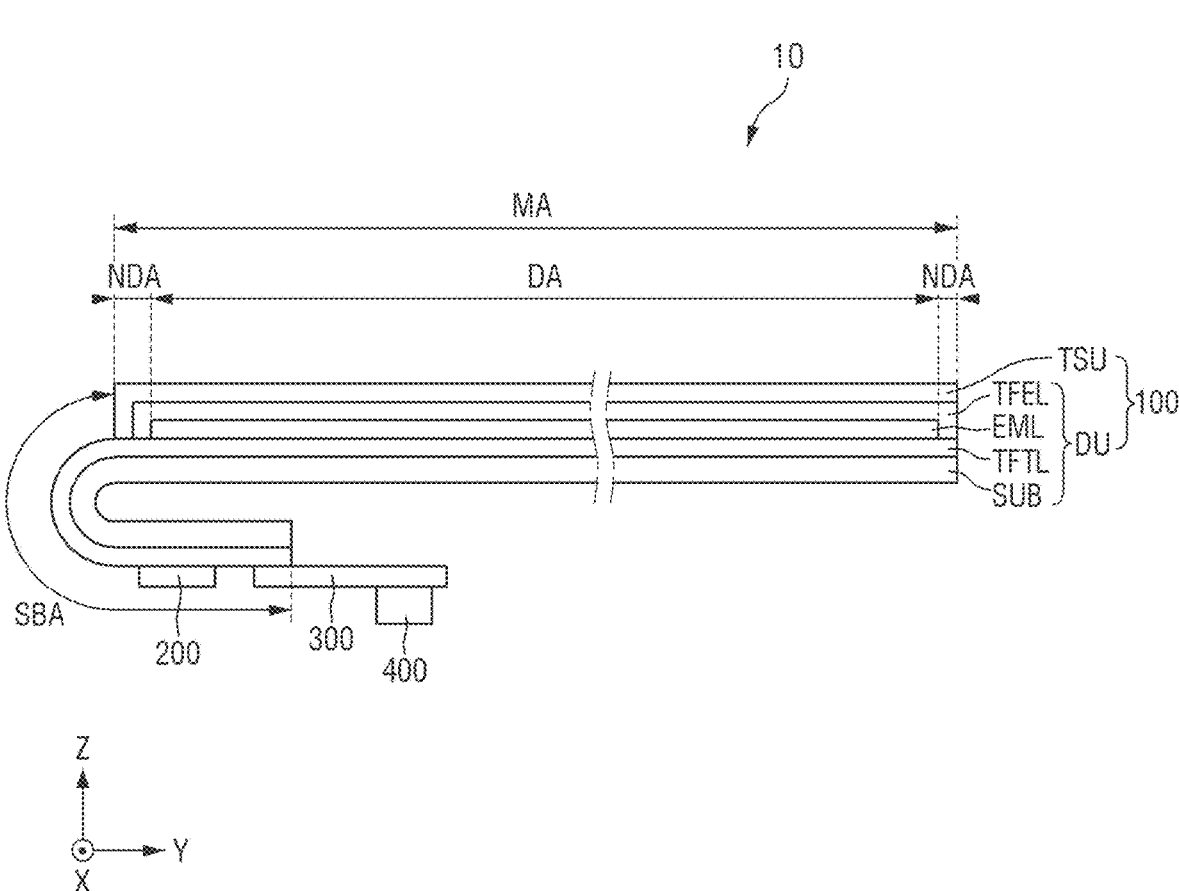
FIG. 2 is a side cross-sectional view illustrating further details of the display device of FIG. 1 according to some embodiments of the present disclosure.

Referring to FIGS. 1 and 2, a display device 10 according to some embodiments may be variously classified according to a display method. For example, the display device 10 may be classified into and include an organic light emitting diode display (OLED), an inorganic light emitting display (inorganic EL), a quantum dot light emitting display (QED), a micro LED display (micro-LED), a nano LED display, a plasma display panel (PDP), a field emission display (FED), a liquid crystal display (LCD), an electrophoretic display (EPD), and the like. Hereinafter, an organic light emitting diode display (OLED) will be described as an example of the display device 10 according to some embodiments, and unless a special distinction is required, the organic light emitting diode display (OLED) applied to the embodiments will be abbreviated as the display device 10. The display device 10 according to some embodiments is not limited to the organic light emitting diode display (OLED), and other display devices listed above or known in the art may be applied within the scope of sharing technical ideas.

Meanwhile, the display device 10 according to some embodiments may be applied to a center information display (CID) located on an instrument panel of a vehicle, a center fascia of a vehicle, and a dashboard of a vehicle, and may also be applied as a room mirror display device instead of a side mirror. Electronic devices such as the display device 10 used in the vehicle have strict restrictions on the amount of electromagnetic interference (EMI) radiation. Therefore, a technology for minimizing the amount of EMI radiation needs to be additionally applied to the display device 10 used in the vehicle.

Meanwhile, the display device 10 according to some embodiments may also be applied to portable electronic devices such as a mobile phone, a smart phone, a tablet personal computer (PC), a mobile communication terminal, an electronic notebook, an electronic book, a portable multimedia player (PMP), navigation, and an ultra mobile PC (UMPC). For example, the display device 10 may also be applied as a display unit of a television, a laptop computer, a monitor, a billboard, or the Internet of Things (IoT). As another example, the display device 10 may also be applied to wearable devices such as a smart watch, a watch phone, a glasses-type display, and a head mounted display (HMD).

The display device 10 according to some embodiments may have a rectangular shape, a square shape, a circular shape, or an elliptical shape in a plan view. For example, when the display device 10 is applied to the vehicle, the display device 10 may also have a rectangular shape of which long sides are positioned in a horizontal direction. However, embodiments according to the present disclosure are not limited thereto, and the long sides of the display device 10 may be positioned in a vertical direction, and the display device 10 may be rotatably installed, such that the long sides of the display device 10 may also be variably positioned in the horizontal or vertical direction.

As illustrated in FIGS. 1 and 2, the display device 10 includes a touch detection module including a touch sensing unit (or touch sensor) TSU located on the front surface of a display panel 100 and a touch driving circuit 400 generating touch position coordinate data of the touch sensing unit TSU.

In addition, the display device 10 may further include a display driving circuit 200 for controlling driving of the display panel 100, and a proximity detection sensing unit (or proximity detection sensor) 410 for detecting a touch input device or a body portion that is close to a front direction of the display panel 100.

Specifically, the display panel 100 of the display device 10 includes a display unit DU for displaying an image, and the touch sensing unit TSU for detecting a touch of a body portion such as a finger and a touch input device such as an electronic pen is located on the display panel 100. The display unit (or display) DU of the display panel 100 may include a plurality of pixels and display an image through the plurality of pixels. Here, each of the pixels may include red, green, and blue sub-pixels, or may include red, green, blue, and white sub-pixels.

The touch sensing unit TSU of the display panel 100 may be mounted on the front surface of the display panel 100 or formed integrally with the display panel 100. The touch sensing unit TSU may include a plurality of touch electrodes to detect a user's touch in a capacitive manner using the touch electrodes. Detailed components and structural features of the touch sensing unit TSU will be described later in more detail with reference to the accompanying drawings.

The display driving circuit 200 may output signals and voltages for driving the pixels of the display unit DU, that is, the respective sub-pixels. The display driving circuit 200 may supply data voltages to data lines to which the sub-pixels are connected. The display driving circuit 200 may supply a power voltage to a power line and may supply gate control signals to a gate driving unit (or gate driver 210. Meanwhile, the display driving circuit 200 may be divided into a display driving circuit 200 performing a timing control function and a data driving unit (or data driver) supplying the data voltages to the data lines. In this case, the display driving circuit 200 may control driving timings of the gate driving unit 210 and the data driving unit by supplying a timing control signal to the gate driving unit 210 and the data driving unit.

The display driving circuit 200 may be formed as an integrated circuit (IC) and mounted on the display panel 100 by a chip on glass (COG) method, a chip on plastic (COP) method, or an ultrasonic bonding method. For example, the display driving circuit 200 may be located in a sub-area SBA, and may overlap a main area MA in a thickness direction (Z-axis direction) by bending of the sub-area SBA. As another example, the display driving circuit 200 may also be mounted on a circuit board 300.

The touch driving circuit 400 may be electrically connected to the touch sensing unit TSU. The touch driving circuit 400 may supply touch driving signals to the plurality of touch electrodes arranged in the touch sensing unit TSU, and may sense an amount of change in capacitance between the plurality of touch electrodes. The touch driving circuit 400 may calculate whether a user's touch input is made and touch coordinates based on the amount of change in capacitance between the plurality of touch electrodes.

The display driving circuit 200 may operate as a main processor or may be formed integrally with the main processor. Accordingly, the display driving circuit 200 may control the overall function of the display device 10. For example, the display driving circuit 200 may receive touch data from the touch driving circuit 400, determine user's touch coordinates, and then generate digital video data according to the touch coordinates. In addition, the display driving circuit 200 may execute an application indicated by an icon displayed on the user's touch coordinates. As still another example, the display driving circuit 200 may receive coordinate data from an electronic pen or the like, determine touch coordinates of the electronic pen, and then generate digital video data according to the touch coordinates, or may also execute an application indicated by an icon displayed on the touch coordinates of the electronic pen.

Referring to FIG. 2, the display panel 100 may be divided into a main area MA and a sub-area SBA. The main area MA may include a display area DA having sub-pixels displaying an image, and a non-display area NDA arranged around the display area DA. In the display area DA, light may be emitted from a light emitting area or an opening area of each sub-pixel to display an image. To this end, the sub-pixels of the display area DA may include a pixel circuit including switching elements, a pixel defining layer defining the light emitting area or the opening area, and a self-light emitting element.

The non-display area NDA may be an area outside the display area DA. The non-display area NDA may be defined as an edge area of the main area MA of the display panel 100. The non-display area NDA may include a gate driving unit (or gate driver) supplying gate signals to the gate lines, and fan-out lines connecting the display driving circuit 200 and the display area DA.

The sub-area SBA may extend from one side of the main area MA. The sub-area SBA may include a flexible material that may be bent, folded, rolled, or the like. For example, when the sub-area SBA is bent, the sub-area SBA may overlap the main area MA in the thickness direction (Z-axis direction). The sub-area SBA may include the display driving circuit 200 and a pad portion connected to the circuit board 300. Optionally, the sub-area SBA may be omitted, and the display driving circuit 200 and the pad portion may be located in the non-display area NDA.

The circuit board 300 may be attached onto the pad portion of the display panel 100 using an anisotropic conductive film (ACF). Lead lines of the circuit board 300 may be electrically connected to the pad portion of the display panel 100. The circuit board 300 may be a flexible film such as a flexible printed circuit board, a printed circuit board, or a chip on film.

Meanwhile, the substrate SUB of the display panel 100 illustrated in FIG. 2 may be a base substrate or a base member. The substrate SUB may be a flat type. Unlike this, the substrate SUB may be a flexible substrate that may be bent, folded, rolled, or the like. For example, the substrate SUB may include a glass material or a metal material, but is not limited thereto. As another example, the substrate SUB may include a polymer resin such as polyimide PI.

The thin film transistor layer TFTL may be located on the substrate SUB.

The thin film transistor layer TFTL may include a plurality of thin film transistors constituting the pixel circuit of the sub-pixels SP. The thin film transistor layer TFTL may further include gate lines, data lines, power lines, gate control lines, fan-out lines connecting the display driving circuit 200 and the data lines, and lead lines connecting the display driving circuit 200 and the pad portion. When the gate driving unit 210 is formed on one side or both sides of the non-display area NDA of the display panel 100, the gate driving unit 210 may also include the thin film transistors.

The thin film transistor layer TFTL may be located in the display area DA, the non-display area NDA, and the sub-area SBA. The thin film transistors, the gate lines, the data lines, and the power lines of each of the pixels of the thin film transistor layer TFTL may be located in the display area DA. The gate control lines and the fan-out lines of the thin film transistor layer TFTL may be located in the non-display area NDA. The lead lines of the thin film transistor layer TFTL may be located in the sub-area SBA.

A light emitting element layer EML may be located on the thin film transistor layer TFTL. The light emitting element layer EML may include a plurality of light emitting elements in which a first electrode, a light emitting layer, and a second electrode are sequentially stacked to emit light, and a pixel defining layer defining pixels. The plurality of light emitting elements of the light emitting element layer EML may be located in the display area DA.

An encapsulation layer TFEL may cover an upper surface and side surfaces of the light emitting element layer EML, and may protect the light emitting element layer EML. The encapsulation layer TFEL may include at least one inorganic layer and at least one organic layer for encapsulating the light emitting element layer EML.

The touch sensing unit TSU may be located on the encapsulation layer TFEL of the display panel 100. The touch sensing unit TSU may include a plurality of first touch electrodes for detecting a user's touch in a capacitance method, and touch driving lines connecting the plurality of first touch electrodes and the touch driving circuit 400. The touch sensing unit TSU may sense the user's touch in a self-capacitance method or a mutual capacitance method.

A plurality of second touch electrodes may be located on front surfaces of the plurality of first touch electrodes to correspond to the plurality of first touch electrodes with a touch insulating layer interposed therebetween. The plurality of second touch electrodes may be electrically connected to the plurality of first touch electrodes, respectively, or may be connected to a low potential voltage source such as a ground voltage source by a plurality of driving switching circuits.

The plurality of second touch electrodes may be electrically connected to the low potential voltage source by the plurality of driving switching circuits during a non-touch detection period in which the user's touch does not occur. The plurality of second touch electrodes connected to the low potential voltage source may reduce the amount of EMI radiation from the front surfaces of the plurality of first touch electrodes.

On the other hand, the plurality of second touch electrodes may be electrically connected to the plurality of first touch electrodes by the plurality of driving switching circuits during a touch detection period in which the user's touch occurs. The plurality of second touch electrodes connected to the plurality of first touch electrodes may be connected to the plurality of first touch electrodes in a parallel structure to detect the user's touch in the same method as the plurality of first touch electrodes in the capacitance method.

The touch sensing unit TSU may not be formed integrally with the display panel 100, but may be located on a separate substrate or film located on the display unit DU of the display panel 100. In this case, a substrate or film supporting the touch sensing unit TSU on the display unit DU, or a substrate or film located between the display unit DU and the touch sensing unit TSU may be a base member for encapsulating the display unit DU.

The plurality of touch electrodes included in the touch sensing unit TSU may be located in a touch sensor area overlapping the display area DA. The touch lines of the touch sensing unit TSU may be located in a touch peripheral area overlapping the non-display area NDA.

The proximity detection sensing unit 410 may be located on a bezel portion formed on a cover of the display device 10, or may be arranged or formed on a surrounding structure on which the display device 10 is mounted. The proximity detection sensing unit 410 may be formed integrally with the display panel 100. The proximity detection sensing unit 410 detects a touch input device such as an electronic pen or a body portion such as a finger that is close to a front direction of the display panel 100. To this end, the proximity detection sensing unit 410 may include at least one sensor of at least on one ultrasonic sensor, at least one infrared sensor, at least one motion detection sensor, and a light emitting and light receiving sensor. The proximity detection sensing unit 410 supplies a proximity detection signal to the display driving circuit 200 and the touch driving circuit 400 when the touch input device or the body portion is detected in the front direction of the display panel 100.

The touch driving circuit 400 may be located on a separate circuit board 300. The touch driving circuit 400 may be formed as an integrated circuit (IC).

The touch driving circuit 400 applies touch driving signals to the first touch electrodes of the touch sensing unit TSU, and measures an amount of charge change in mutual capacitance of each of a plurality of first touch nodes formed by the first touch electrodes.

For example, during the non-touch detection period in which the proximity detection signal is not input, the touch driving circuit 400 electrically separates the first and second touch electrodes from each other by the plurality of driving switching circuits and connects all of the second touch electrodes to the low potential voltage source. Therefore, during the non-touch detection period, the touch driving signals may be supplied only to the first touch electrodes, and the touch detection signal may be output through the first touch electrodes according to a change in capacitance of the first touch nodes. In this case, an EMI signal generated by the touch driving signals supplied to the first touch electrodes may be shielded by the second touch electrodes connected to the low potential voltage source.

On the other hand, during the touch detection period in which the proximity detection signal is input, the touch driving circuit 400 separates all of the second touch electrodes from the low potential voltage source by the plurality of driving switching circuits and electrically connects the first and second touch electrodes to each other. Accordingly, the first and second touch electrodes are connected in a parallel structure between a touch driving signal input terminal and a touch sensing signal output terminal. The touch driving signals may be simultaneously supplied to the first and second touch electrodes, and the touch detection signal may be output through the first touch electrodes according to a change in capacitance of the first touch nodes formed by the first touch electrodes and second touch nodes formed by the second touch electrodes.

The touch driving circuit 400 measures a change in capacitance of the first and second touch nodes according to a change in a voltage level or an amount of current of the touch detection signal received through the first and second touch electrodes having the parallel structure. In this way, the touch driving circuit 400 may determine a user's touch position according to an amount of charge change of the mutual capacitance of each of the first and second touch nodes. Here, the touch driving signal may be a pulse signal having a predetermined frequency. The touch driving circuit 400 calculates whether a touch input of a user's body portion, such as a finger is made and touch coordinates based on the amount of change in capacitance between the plurality of touch electrodes.

Figure 3:
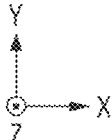
FIG. 3 is a layout view schematically illustrating an example of a display panel according to some embodiments of the present disclosure.

FIG. 3 is a layout view schematically illustrating an example of a display panel according to some embodiments. For example, FIG. 3 is a layout view illustrating a display area DA and a non-display area NDA of the display unit DU before the touch sensing unit TSU is formed.

The display area DA, which is an area displaying an image, may be defined as a central area of the display panel 100. The display area DA may include a plurality of sub-pixels SP, a plurality of gate lines GL, a plurality of data lines DL, and a plurality of power lines VL. Each of the plurality of sub-pixels SP may be defined as a minimum unit for outputting light.

The plurality of gate lines GL may supply the gate signal received from the gate driving unit 210 to the plurality of sub-pixels SP. The plurality of gate lines GL may extend in the X-axis direction and may be spaced apart from each other in the Y-axis direction intersecting the X-axis direction.

The plurality of data lines DL may supply the data voltage received from the display driving circuit 200 to the plurality of sub-pixels SP. The plurality of data lines DL may extend in the Y-axis direction and may be spaced apart from each other in the X-axis direction.

The plurality of power lines VL may supply the power voltage received from the display driving circuit 200 to the plurality of sub-pixels SP. Here, the power voltage may be at least one of a driving voltage, an initialization voltage, or a reference voltage. The plurality of power lines VL may extend in the Y-axis direction and may be spaced apart from each other in the X-axis direction.

The non-display area NDA may surround the display area DA. The non-display area NDA may include a gate driving unit 210, fan-out lines FOL, and gate control lines GCL. The gate driving unit 210 may generate a plurality of gate signals based on the gate control signals, and may sequentially supply the plurality of gate signals to the plurality of gate lines GL according to a set order.

The fan-out lines FOL may extend from the display driving circuit 200 to the display area DA. The fan-out lines FOL may supply the data voltage received from the display driving circuit 200 to the plurality of data lines DL.

The gate control line GCL may extend from the display driving circuit 200 to the gate driving unit 210. The gate control line GCL may supply the gate control signals received from the display driving circuit 200 to the gate driving unit 210.

The display driving circuit 200 may output signals and voltages for driving the display panel 100 to the fan-out lines FOL. The display driving circuit 200 may supply the data voltage to the data lines DL through the fan-out lines FOL. The data voltage may be supplied to the plurality of sub-pixels SP and may determine luminance of the plurality of sub-pixels SP. The display driving circuit 200 may supply the gate control signals to the gate driving unit 210 through the gate control line GCL.

Figure 4:
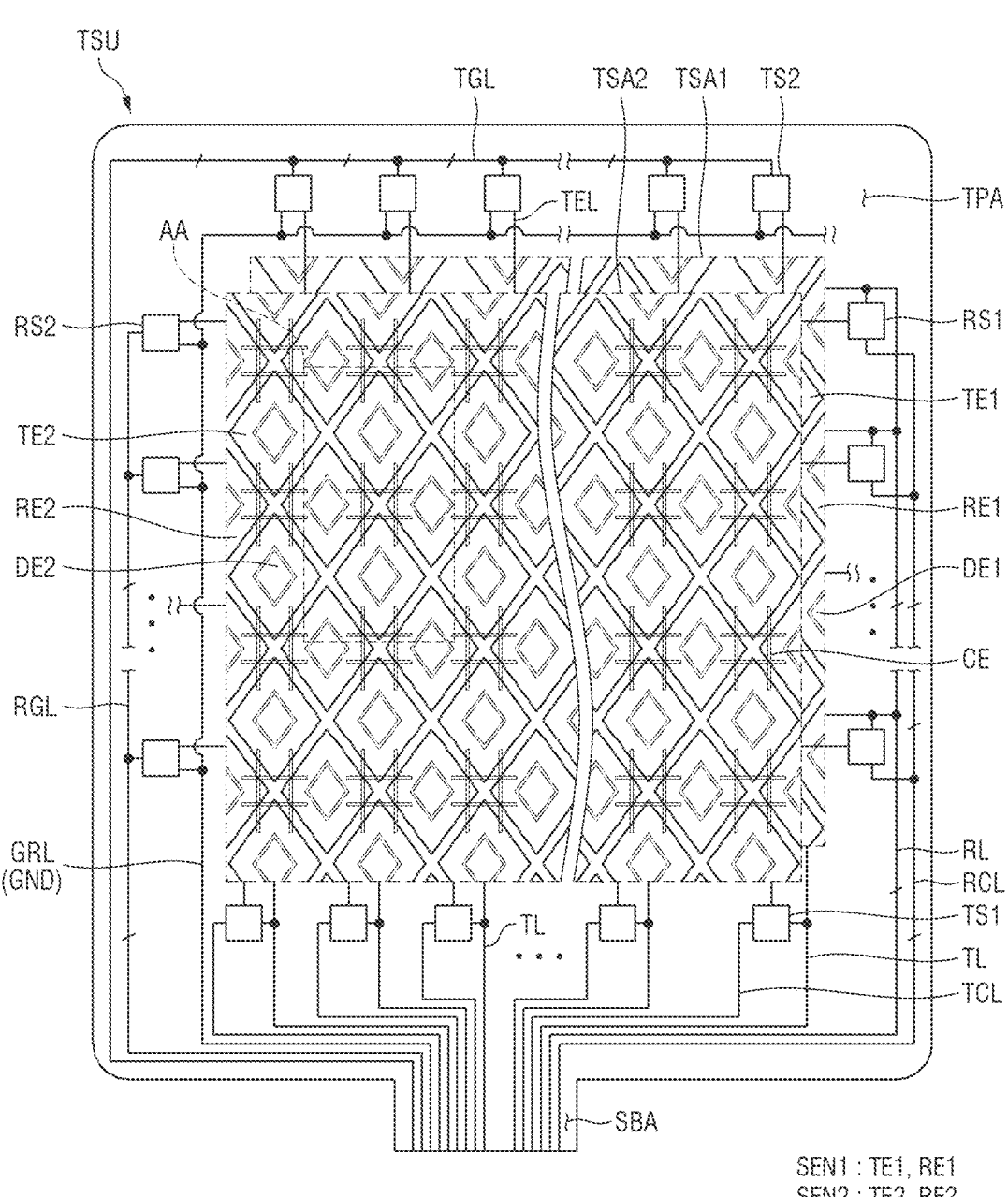
FIG. 4 is a layout view schematically illustrating an example of a touch detection module according to some embodiments of the present disclosure.

FIG. 4 is a layout view schematically illustrating an example of a touch detection module according to some embodiments.

A structure in which first touch electrodes SEN1 and second touch electrodes SEN2 are located in the main area MA to overlap each other to correspond to each other as a double layer with a touch insulating layer interposed therebetween will be described as an example with reference to FIG. 4. The first touch electrodes SEN1 may include two types of electrodes, for example, first driving electrodes TE1 and first detection electrodes RE1, and the second touch electrodes SEN2 may include two types of electrodes, for example, second driving electrodes TE2 and second detection electrodes RE2. Accordingly, a driving example of a mutual capacitance method in which an amount of charge change of mutual capacitance of each of the plurality of touch nodes is detected through the first detection electrodes RE1 after applying the touch driving signal to the first driving electrodes TE1 by connecting the first and second touch electrodes SEN1 and SEN2 in a parallel structure in the touch detection period will be described. However, the driving method of the mutual capacitance method is not limited thereto.

FIG. 4 only partially illustrates the first touch electrodes SEN1 including the first driving electrodes TE1 and the first detection electrodes RE1, first dummy electrodes DE1, the second touch electrodes SEN2 including the second driving electrodes TE2 and the second detection electrodes RE2, and touch lines TL and RL for convenience of explanation.

The main area MA of the touch sensing unit TSU includes a first touch detection layer TSA1 on which first touch electrodes SEN1 for detecting a user's touch and the first dummy electrodes DE1 are located, and a second touch detection layer TSA2 on which the second touch electrodes SEN2 for selectively reducing an amount of EMI radiation or detecting a user's touch, and second dummy electrodes DE2 are located.

The touch sensing unit TSU includes a touch peripheral area TPA that is a peripheral area of the first and second touch detection layers TSA1 and TSA2. The first and second touch detection layers TSA1 and TSA2 may overlap the display area DA of FIGS. 1 to 3, and the touch peripheral area TPA may overlap the non-display area NDA.

The first driving electrodes TE1, the first detection electrodes RE1, and the first dummy electrodes DE1 are located on the first touch detection layer TSA1. The first driving electrodes TE1 and the first detection electrodes RE1 may be electrodes for forming mutual capacitance to detect a touch of a touch input device or a body portion.

The first driving electrodes TE1 may be arranged in parallel in the X-axis direction and the Y-axis direction. The first driving electrodes TE1 adjacent in the X-axis direction may be electrically disconnected from each other, and the first driving electrodes TE1 adjacent in the Y-axis direction may be electrically connected to each other. Here, the first driving electrodes TE1 adjacent in the Y-axis direction may be connected to each other through a separate connection electrode CE.

The first detection electrodes RE1 may be arranged in parallel in the X-axis direction and the Y-axis direction. The first detection electrodes RE1 may be electrically connected to each other in the X-axis direction. The first detection electrodes adjacent in the X-axis direction may be connected to each other. In addition, the first detection electrodes RE1 adjacent in the Y-axis direction may be electrically disconnected from each other. Accordingly, the first touch node at which mutual capacitance is formed may be located at each of intersection portions of the first driving electrodes TE1 and the first detection electrodes RE1. The plurality of first touch nodes may correspond to the intersection portions of the first driving electrodes TE1 and the first detection electrodes RE1.

Each of the first dummy electrodes DE1 may be arranged to be surrounded by the first driving electrode TE1 or the first detection electrode RE1. Each of the first dummy electrodes DE1 may be electrically disconnected from the first driving electrode TE1 or the first detection electrode RE1. Each of the first dummy electrodes DE1 may be spaced apart from the first driving electrode TE1 or the first detection electrode RE1. Each of the first dummy electrodes DE1 may be electrically floating.

The second driving electrodes TE2, the second detection electrodes RE2, and the second dummy electrodes DE2 are located on the second touch detection layer TSA2. The second driving electrodes TE2 and the second detection electrodes RE2 may be electrodes for forming mutual capacitance to detect a touch of a touch input device or a body portion.

The second driving electrodes TE2 are located in the front direction of the first driving electrodes TE1 to correspond to the first driving electrodes TE1 with a touch insulating layer interposed therebetween. The first and second driving electrodes TE1 and TE2 may be arranged to be parallel to each other or to face each other. The second driving electrodes TE2 may be arranged in parallel in the X-axis direction and the Y-axis direction in the same manner as the first driving electrodes TE1. The second driving electrodes TE2 adjacent in the X-axis direction may be electrically disconnected from each other, and the second driving electrodes TE2 adjacent in the Y-axis direction may be electrically connected to each other. Here, the second driving electrodes TE2 adjacent in the Y-axis direction may be connected to each other through a separate connection electrode CE.

The second detection electrodes RE2 are arranged in the front direction of the first detection electrodes RE1 to correspond to the first detection electrodes RE1 with a touch insulating layer interposed therebetween. The first and second detection electrodes RE1 and RE2 may be arranged to be parallel to each other or to face each other.

The second detection electrodes RE2 may be arranged in parallel in the X-axis direction and the Y-axis direction in the same manner as the first detection electrodes RE1. The second detection electrodes RE2 may be electrically connected to each other in the X-axis direction. The second detection electrodes adjacent in the X-axis direction may be connected to each other. In addition, the second detection electrodes RE2 adjacent in the Y-axis direction may be electrically disconnected from each other. Accordingly, the second touch node at which mutual capacitance is formed may be located at each of intersection portions of the second driving electrodes TE2 and the second detection electrodes RE2. The plurality of second touch nodes may correspond to the intersection portions of the second driving electrodes TE2 and the second detection electrodes RE2.

Each of the second dummy electrodes DE2 may be arranged to be surrounded by the second driving electrode TE2 or the second detection electrode RE2. Each of the second dummy electrodes DE2 may be electrically disconnected from the second driving electrode TE2 or the second detection electrode RE2 and may be electrically floating.

Although it is illustrated in FIG. 4 that each of the first and second driving electrodes TE1 and TE2, the first and second detection electrodes RE1 and RE2, and the first and second dummy electrodes DE1 and DE2 has a rhombus planar shape, embodiments according to the present disclosure are not limited thereto. For example, each of the first and second driving electrodes TE1 and TE2, the first and second detection electrodes RE1 and RE2, and the first and second dummy electrodes DE1 and DE2 may be formed in a planar shape of a quadrangle other than a rhombus, a polygon other than the quadrangle, a circle, or an ellipse.

The touch lines TL and RL may be located in the touch peripheral area TPA. The touch lines TL and RL include touch driving lines TL connected to the first driving electrodes TE1 and touch detection lines RL connected to the first detection electrodes RE1.

Each of the first detection electrodes RE1 located at an end on one side of the first touch detection layer TSA1 may be connected to the touch detection lines RL in a one-to-one manner. For example, as illustrated in FIG. 4, each of the first detection electrodes RE1 located at a right end among the first detection electrodes RE1 electrically connected to each other in the X-axis direction may be connected to each of the touch detection lines RL. In addition, each of the touch detection lines RL may be electrically connected to the touch driving circuit 400 through a separate pad portion.

The first driving electrodes TE1 located at an end of one side of the first touch detection layer TSA1 are connected to the touch driving lines TL in one-to-one manner. For example, the first driving electrodes TE1 located at a lower end among the first driving electrodes TE1 electrically connected in the Y-axis direction may be respectively connected to the touch driving lines TL. The touch driving lines TL may be electrically connected to the touch driving circuit 400 through a separate pad portion.

The touch peripheral area TPA includes driving switching circuits TS1 and TS2 electrically connecting the second driving electrodes TE2 connected to each other in the Y-axis direction to the respective first driving electrodes TE1 corresponding to each other in the first touch detection layer TSA1 or a low potential voltage source GND.

For example, the driving switching circuits TS1 and TS2 are divided into first driving switching circuits TS1 and second driving switching circuits TS2.

The first driving switching circuits TS1 electrically connect or disconnect the respective second driving electrodes TE2 connected in the Y-axis direction in the second touch detection layer TSA2 to or from the respective first driving electrodes TE1 corresponding to each other in the first touch detection layer TSA1 in response to a first switching control signal from the touch driving circuit 400.

The first driving switching circuits TS1 may be respectively disposed on one side of the first and second driving electrodes TE1 and TE2 arranged to overlap each other. The first driving switching circuits TS1 may be turned on by the first switching control signal input though the first switching signal lines TCL to electrically connect the respective second driving electrodes TE2 to the touch driving lines TL or the respective first driving electrodes TE1 corresponding to each other in the first touch detection layer TSA1. On the other hand, the first driving switching circuits TS1 may be turned off by the first switching control signal to disconnect the respective second driving electrodes TE2 from the touch driving lines TL or the first driving electrodes TE1.

The touch driving circuit 400 may supply a first switching control signal of a turn-on level to the first switching signal lines TCL so that the first driving switching circuits TS1 are turned on during the touch detection period. In addition, the touch driving circuit 400 may supply a first switching control signal of a turn-off level to the first switching signal lines TCL so that the first driving switching circuits TS1 are turned off during the non-touch detection period.

The second driving switching circuits TS2 connect or disconnect the second driving electrodes TE2 connected to each other in the Y-axis direction in the second touch detection layer TSA2 to or from the low potential voltage source GND in response to a second switching control signal from the touch driving circuit 400.

The second driving switching circuits TS2 may be respectively located on the other side of the first and second driving electrodes TE1 and TE2 arranged to overlap each other. The second driving switching circuits TS2 may be turned on by a second switching control signal input through the second switching signal lines TGL to electrically connect the respective second driving electrodes TE2 to a low potential line GRL to which the low potential voltage source GND is applied. On the other hand, the second driving switching circuits TS2 may be turned off by the second switching control signal to disconnect the respective second driving electrodes TE2 from the low potential line GRL.

The touch driving circuit 400 may supply a second switching control signal of a turn-off level to the second switching signal lines TGL so that the second driving switching circuits TS2 are turned off during the touch detection period. In addition, the touch driving circuit 400 may supply a second switching control signal of a turn-on level to the second switching signal lines TGL so that the second driving switching circuits TS2 are turned on during the non-touch detection period.

In addition, the touch peripheral area TPA includes detection switching circuits RS1 and RS2 electrically connecting the second detection electrodes RE2 connected to each other in the X-axis direction to the respective first detection electrodes RE1 corresponding to each other in the first touch detection layer TSA1 or a low potential voltage source GND.

For example, the detection switching circuits RS1 and RS2 are divided into first detection switching circuits RS1 and second detection switching circuits RS2.

The first detection switching circuits RS1 electrically connect or disconnect the respective second detection electrodes RE2 connected to each other in the X-axis direction in the second touch detection layer TSA2 to or from the respective first detection electrodes TE1 corresponding to each other in the first touch detection layer TSA1 in response to a third switching control signal from the touch driving circuit 400.

The first detection switching circuits RS1 may be respectively located on one side of the first and second detection electrodes RE1 and RE2 arranged to overlap each other. The first detection switching circuits RS1 may be turned on by the third switching control signal input though a third switching signal lines RCL to electrically connect the respective second detection electrodes RE2 to the touch detection lines RL or the respective first detection electrodes RE1 corresponding to each other in the first touch detection layer TSA1. On the other hand, the first detection switching circuits RS1 may be turned off by the third switching control signal to disconnect the respective second detection electrodes RE2 from the touch detection lines RL or the first detection electrodes RE1.

The touch driving circuit 400 may supply a third switching control signal of a turn-on level to the third switching signal lines RCL so that the first detection switching circuits RS1 are turned on during the touch detection period. In addition, the touch driving circuit 400 may supply a third switching control signal of a turn-off level to the third switching signal lines RCL so that the first detection switching circuits RS1 are turned off during the non-touch detection period.

The second detection switching circuits RS2 connect or disconnect the second detection electrodes RE2 connected to each other in the X-axis direction in the second touch detection layer TSA2 to or from the low potential voltage source GND in response to a fourth switching control signal from the touch driving circuit 400.

The second detection switching circuits RS2 may be respectively located on the other side of the first and second detection electrodes RE1 and RE2 arranged to overlap each other. The second detection switching circuits RS2 may be turned on by a fourth switching control signal input through fourth switching signal lines RGL to electrically connect the respective second detection electrodes RE2 to a low potential line GRL to which the low potential voltage source GND is applied. On the other hand, the second detection switching circuits RS2 may be turned off by the fourth switching control signal to disconnect the respective second detection electrodes RE2 from the low potential line GRL.

The touch driving circuit 400 may supply a fourth switching control signal of a turn-off level to the fourth switching signal lines RGL so that the second detection switching circuits RS2 are turned off during the touch detection period. In addition, the touch driving circuit 400 may supply a fourth switching control signal of a turn-on level to the fourth switching signal lines RGL so that the second detection switching circuits RS2 are turned on during the non-touch detection period.

Figure 5:
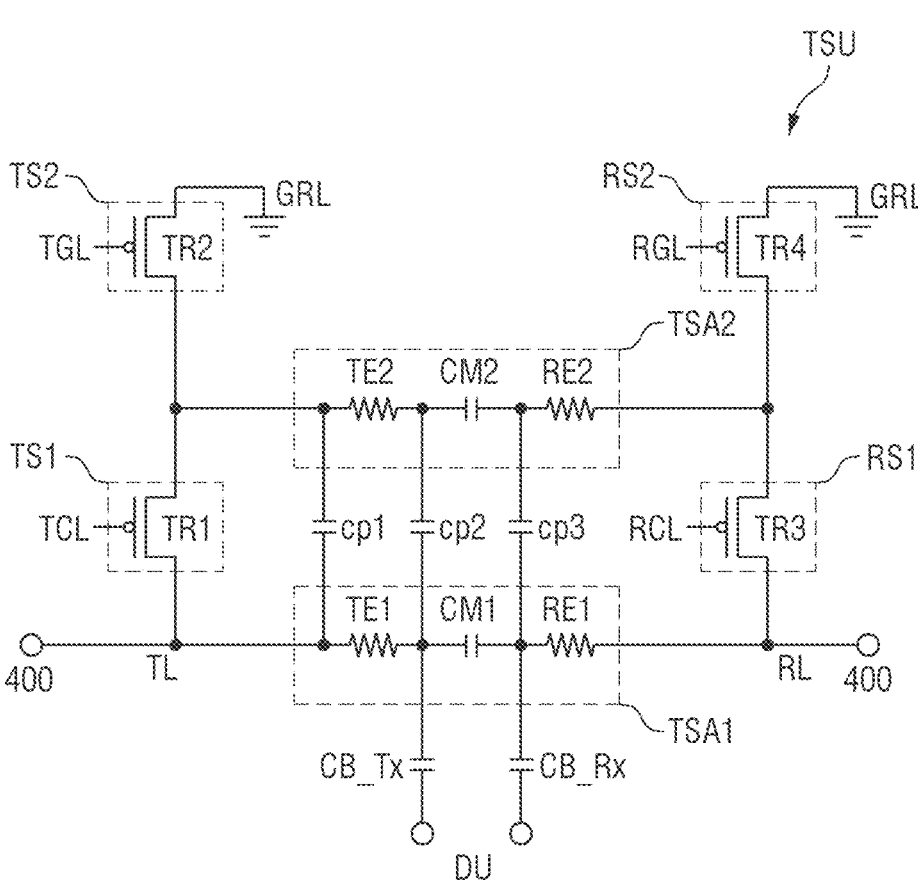
FIG. 5 is a circuit diagram illustrating further details of the first and second touch electrodes, driving switching circuits, and detection switching circuits illustrated in FIG. 4 according to some embodiments of the present disclosure.

FIG. 5 is a circuit diagram illustrating an example of each of the first and second touch electrodes, driving switching circuits, and detection switching circuits illustrated in FIG. 4.

Referring to FIG. 5, the second touch electrodes SEN2 of the second touch detection layer TSA2, that is, the second driving electrodes TE2 and the second detection electrodes RE2 overlap the first touch electrodes SEN1 of the first touch detection layer TSA1 located in a rear direction, that is, the first driving electrodes TE1 and the first detection electrodes RE1. A plurality of parasitic capacitors cp1, cp2, and cp3 may be formed between the first touch electrodes SEN1 and the second touch electrodes SEN2 according to an electrical connection relationship between the first touch electrodes SEN1 and the second touch electrodes SEN2. In addition, load capacitors CB_Tx and CB_Rx may also be formed in some areas between the first touch electrodes SEN1 of the first touch detection layer TSA1 and the sub-pixels SP of the display unit DU.

A first touch node CM1 in which mutual capacitance is formed may be defined at each of intersection portions of the first driving electrodes TE1 and the first detection electrodes RE1 of the first touch detection layer TSA1. Similarly, a second touch node CM2 in which mutual capacitance is formed may be defined at each of intersection portions of the second driving electrodes TE2 and the second detection electrodes RE2 of the second touch detection layer TSA2.

The first driving switching circuits TS1 may include at least one first switching element TR1 that electrically connects or disconnect the second driving electrode TE2 to or from the first driving electrode TE1 in response to the first switching control signal input through the first switching signal line TCL. The first switching element TR1 may be turned on by the first switching control signal of the turn-on voltage level applied during the touch detection period to electrically connect the second driving electrode TE2 to the touch driving line TL or the first driving electrode TE1. In addition, the first switching element TR1 may be turned off by the first switching control signal of the turn-off voltage level applied during the non-touch detection period to electrically disconnect the second driving electrode TE2 from the touch driving line TL or the first driving electrode TE1.

The second driving switching circuits TS2 may include at least one second switching element TR2 that electrically connects or disconnect the second driving electrode TE2 to or from the low potential line GRL to which the low potential voltage source GND is applied, in response to the second switching control signal input through the second switching signal line TGL. The second switching element TR2 is turned off by the second switching control signal of the turn-off voltage level applied during the touch detection period to electrically disconnect the second driving electrode TE2 from the low potential line GRL. In addition, the second switching element TR2 is turned on by the second switching control signal of the turn-on voltage level applied during the non-touch detection period to electrically connect the second driving electrode TE2 to the low potential line GRL.

The first detection switching circuits RS1 may include at least one third switching element TR3 that electrically connects or disconnect the second detection electrode RE2 to or from the touch detection line RL or the first detection electrode RE1 in response to the third switching control signal input through the third switching signal line RCL. The third switching element TR3 may be turned on by the third switching control signal of the turn-on voltage level applied during the touch detection period to electrically connect the second detection electrode RE2 to the touch detection line RL or the first detection electrode RE1. In addition, the third switching element TR3 may be turned off by the third switching control signal of the turn-off voltage level applied during the non-touch detection period to electrically disconnect the second detection electrode RE2 from the touch detection line RL or the first detection electrode RE1.

The second detection switching circuits RS2 may include at least one fourth switching element TR4 that electrically connects or disconnect the second detection electrode RE2 to or from the low potential line GRL to which the low potential voltage source GND is applied, in response to the fourth switching control signal input through the fourth switching signal line RGL. The fourth switching element TR4 is turned off by the fourth switching control signal of the turn-off voltage level applied during the touch detection period to electrically disconnect the second detection electrode RE2 from the low potential line GRL. In addition, the fourth switching element TR4 is turned on by the fourth switching control signal of the turn-on voltage level applied during the non-touch detection period to electrically connect the second detection electrode RE2 to the low potential line GRL.

Figure 6:
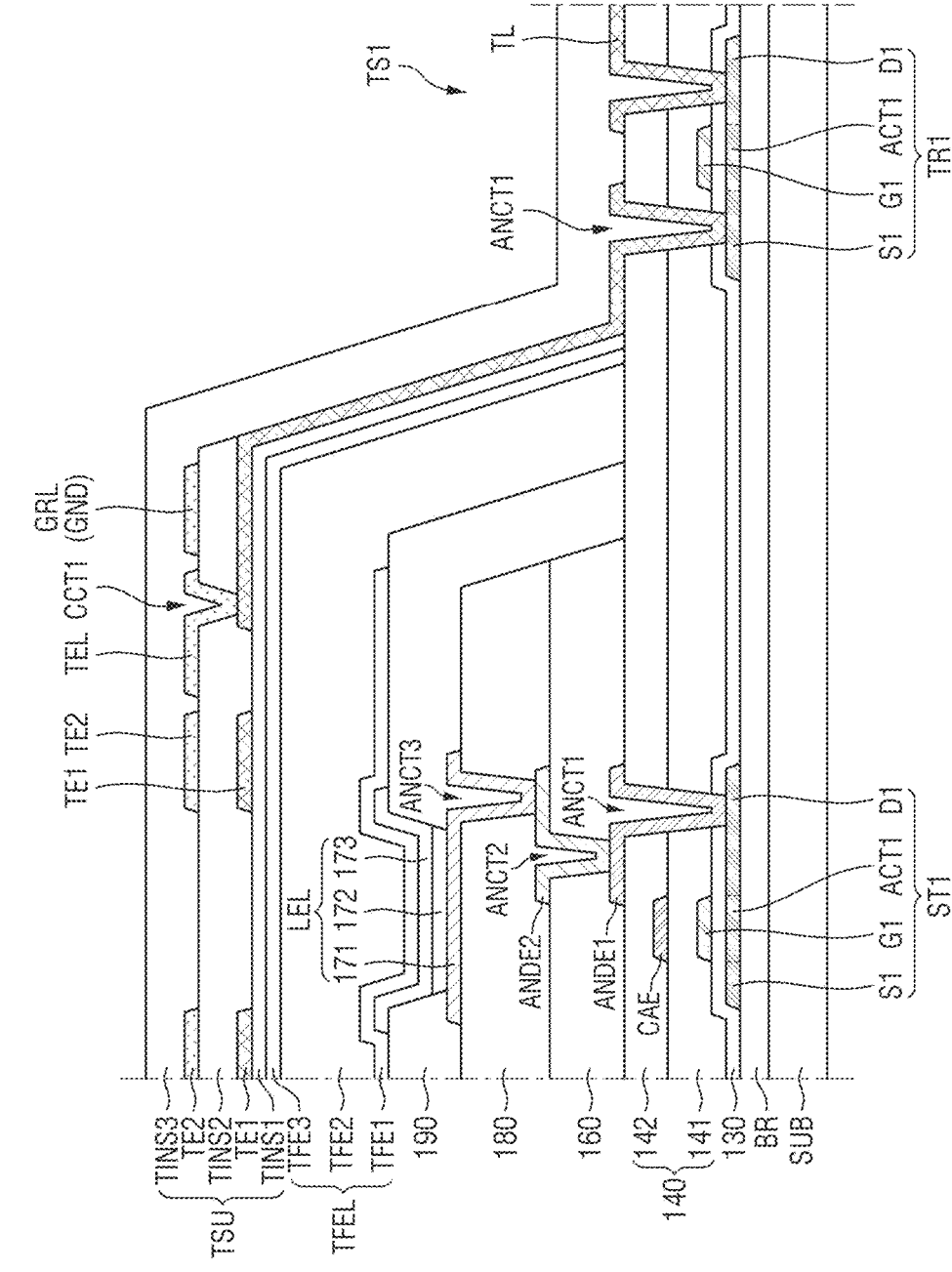
FIG. 6 is a cross-sectional view illustrating a cross-sectional structure of a sub-pixel of a display area, first and second touch detection layers overlapping the display area, and any one of the first switching elements formed in a non-display area according to some embodiments of the present disclosure.

FIG. 6 is a cross-sectional view illustrating a cross-sectional structure of a sub-pixel of a display area, first and second touch detection layers overlapping the display area, and any one of the first switching elements formed in a non-display area.

Referring to FIG. 6, a barrier layer BR may be first located on the substrate SUB on which the sub-pixels of the display area DA and the first switching elements TR1 of the non-display area NDA are formed. Here, the substrate SUB may be made of an insulating material such as a polymer resin. For example, the substrate SUB may be made of polyimide, glass, or the like. The substrate SUB may be a flexible substrate that may be bent, folded, rolled, or the like. Unlike this, the substrate SUB may be a flat type substrate.

The barrier layer BR is a layer for protecting the transistors of the thin film transistor layer TFTL and a light emitting layer 172 of the light emitting element layer EML from moisture permeating through the substrate SUB, which is vulnerable to moisture permeability. The barrier layer BR may be made of a plurality of inorganic layers alternately stacked. For example, the barrier layer BR may be formed of a multilayer layer in which one or more inorganic layers of a silicon nitride layer, a silicon oxynitride layer, a silicon oxide layer, a titanium oxide layer, and an aluminum oxide layer are alternately stacked.

Thin film transistors ST1 are located on the barrier layer BR on which the sub-pixels are formed. In addition, the first to fourth switching elements TR1 to TR4 are located in the non-display area NDA. The first switching element TR1 is disposed in the non-display area NDA illustrated in FIG. 6.

Each of the thin film transistor ST1 and the first to fourth switching elements TR1 to TR4 of the non-display area NDA includes an active layer ACT1, a gate electrode G1, a source electrode S1, and a drain electrode D1. Each of the thin film transistor ST1 and the first to fourth switching elements TR1 to TR4 may be simultaneously formed through the same process. Hereinafter, for convenience of explanation, the thin film transistors ST1 of the same process as that of the first switching element TR1 illustrated in FIG. 6 will be described.

The active layer ACT1, the source electrode S1, and the drain electrode D1 of each of the thin film transistors ST1 may be located on the barrier layer BR on which the sub-pixel are formed. The active layer ACT1 of the thin film transistor ST1 includes at least one of polycrystalline silicon, single crystal silicon, low-temperature polycrystalline silicon, amorphous silicon, or an oxide semiconductor. The active layer ACT1 overlapping the gate electrode G1 in the third direction (Z-axis direction), which is the thickness direction of the substrate SUB, may be defined as a channel region. The source electrode S1 and the drain electrode D1 are regions that do not overlap the gate electrode G1 in the third direction (Z-axis direction), and may have conductivity by doping a silicon semiconductor or an oxide semiconductor with ions or impurities.

A gate insulating layer 130 may be located on the active layer ACT1, the source electrode S1, and the drain electrode D1 of the thin film transistor ST1. The gate insulating layer 130 may be formed of an inorganic layer, for example, a silicon nitride layer, a silicon oxynitride layer, a silicon oxide layer, a titanium oxide layer, or an aluminum oxide layer.

The gate electrode G1 of the thin film transistor ST1 may be located on the gate insulating layer 130. The gate electrode G1 may overlap the active layer ACT1 in the third direction (Z-axis direction). The gate electrode G1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first interlayer insulating layer 141 may be located on the gate electrode G1 of the thin film transistor ST1. The first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may be formed of a plurality of inorganic layers.

A capacitor electrode CAE may be located on the first interlayer insulating layer 141. The capacitor electrode CAE may overlap a gate electrode G1 of a first thin film transistor ST1 in the third direction (Z-axis direction). Since the first interlayer insulating layer 141 has a predetermined dielectric constant, a capacitor may be formed by the capacitor electrode CAE, the gate electrode G1, and the first interlayer insulating layer 141 located between the capacitor electrode CAE and the gate electrode G1. The capacitor electrode CAE may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second interlayer insulating layer 142 may be located on the capacitor electrode CAE. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may be formed of a plurality of inorganic layers.

A first anode connection electrode ANDE1 may be located on the second interlayer insulating layer 142. The first anode connection electrode ANDE1 may be connected to the drain electrode D1 of the thin film transistor ST1 through a first connection contact hole ANCT1 penetrating through the gate insulating layer 130, the first interlayer insulating layer 141, and the second interlayer insulating layer 142. The first anode connection electrode ANDE1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first planarization layer 160 for planarizing a step caused by the thin film transistor ST1 may be located on the first anode connection electrode ANDE1. The first planarization layer 160 may be formed as an organic layer made of an acryl resin, an epoxy resin, a phenolic resin, a polyamide resin, a polyimide resin, or the like.

A second anode connection electrode ANDE2 may be located on the first planarization layer 160. The second anode connection electrode ANDE2 may be connected to the first anode connection electrode ANDE1 through a second connection contact hole ANCT2 penetrating through the first planarization layer 160. The second anode connection electrode ANDE2 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second planarization layer 180 may be located on the second anode connection electrode ANDE2. The second planarization layer 180 may be formed as an organic layer made of an acryl resin, an epoxy resin, a phenolic resin, a polyamide resin, a polyimide resin, or the like.

Light emitting elements LEL and a bank 190 may be located on the second planarization layer 180. Each of the light emitting elements LEL includes a pixel electrode 171, a light emitting layer 172, and a common electrode 173.

The pixel electrode 171 may be located on the second planarization layer 180. The pixel electrode 171 may be connected to the second anode connection electrode ANDE2 through a third connection contact hole ANCT3 penetrating through the second planarization layer 180.

In a top emission structure that emits light in a direction of the common electrode 173 with respect to the light emitting layer 172, the pixel electrode 171 may be formed of a metal material having high reflectance, such as a stacked structure (Ti/Al/Ti) of aluminum and titanium, a stacked structure (ITO/Al/ITO) of aluminum and indium tin oxide (ITO), an APC alloy, and a stacked structure (ITO/APC/ITO) of an APC alloy and ITO. The APC alloy is an alloy of silver (Ag), palladium (Pd), and copper (Cu).

The bank 190 may be formed to partition the pixel electrode 171 on the second planarization layer 180 to define each light emitting area. The bank 190 may be arranged to cover an edge of the pixel electrode 171. The bank 190 may be formed of an organic layer such as an acrylic resin, an epoxy resin, a phenolic resin, a polyamide resin, or a polyimide resin. Here, each light emitting area refers to an area in which the pixel electrode 171, the light emitting layer 172, and the common electrode 173 are sequentially stacked and holes from the pixel electrode 171 and electrons from the common electrode 173 are combined with each other in the light emitting layer 172 to emit light.

The light emitting layer 172 may be located on the pixel electrode 171 and the bank 190. The light emitting layer 172 may include an organic material to emit light of a predetermined color. For example, the light emitting layer 172 may include a hole transporting layer, an organic material layer, and an electron transporting layer.

The common electrode 173 may be located on the light emitting layer 172. The common electrode 173 may be arranged to cover the light emitting layer 172. The common electrode 173 may be a common layer commonly formed in the first light emitting area, the second light emitting area, and the third light emitting area. A capping layer may be formed on the common electrode 173.

In the top emission structure, the common electrode 173 may be formed of a transparent conductive material (TCO) such as ITO or indium zinc oxide (IZO) capable of transmitting light, or a semi-transmissive conductive material such as magnesium (Mg), silver (Ag), or an alloy of magnesium (Mg) and silver (Ag). When the common electrode 173 is formed of the semi-transmissive conductive material, light emitting efficiency may be increased by a micro cavity.

An encapsulation layer TFEL may be located on the common electrode 173. The encapsulation layer TFEL may include at least one inorganic layer to prevent or reduce instances of oxygen, moisture, or other contaminants permeating into the light emitting element layer EML. In addition, the encapsulation layer TFEL may include at least one organic layer to protect the light emitting element layer EML from foreign materials such as dust. For example, the encapsulation layer TFEL includes a first encapsulation inorganic film TFE1, an encapsulation organic film TFE2, and a second encapsulation inorganic film TFE3.

The first encapsulation inorganic film TFE1 may be located on the common electrode 173, the encapsulation organic film TFE2 may be located on the first encapsulation inorganic film TFE1, and the second encapsulation inorganic film TFE3 may be located on the encapsulation organic film TFE2. The first encapsulation inorganic film TFE1 and the second encapsulation inorganic film TFE3 may be formed as multiple films in which one or more inorganic layers of a silicon nitride layer, a silicon oxynitride layer, a silicon oxide layer, a titanium oxide layer, and an aluminum oxide layer are alternately stacked. The encapsulation organic film TFE2 may be an organic layer such as an acrylic resin, an epoxy resin, a phenolic resin, a polyamide resin, or a polyimide resin.

A touch sensing unit TSU may be located on the encapsulation layer TFEL.

Referring to FIG. 6, the touch sensing unit TSU includes a first touch insulating layer TINS1 and first driving electrodes TE1 of the first touch detection layer TSA1, and includes a second touch insulating layer TINS2 and second driving electrodes TE2 of the second touch detection layer TSA2. In addition, a contact line TEL and a low potential line GRL of the second driving electrodes TE2 may be formed together with the second driving electrodes TE2 and the second detection electrodes RE2.

The first touch insulating layer TINS1 may be formed as an inorganic layer, for example, a silicon nitride layer, a silicon oxynitride layer, a silicon oxide layer, a titanium oxide layer, or an aluminum oxide layer.

The first driving electrodes TE1 and the first detection electrodes RE1 may be located on the first touch insulating layer TINS1. In addition, the first dummy electrodes DE1, the touch driving lines TL, and the touch detection lines RL illustrated in FIG. 4 as well as the first driving electrodes TE1 and the first detection electrodes RE1 may be located on the first touch insulating layer TINS1.

The first driving electrodes TE1, the first detection electrodes RE1, and the first dummy electrodes DE1 are formed as conductive metal electrodes, and the conductive metal electrode may be formed of any one of molybdenum (Mo), aluminum (Al), chromium (Cr), gold (Au), titanium (Ti), nickel (Ni), neodymium (Nd), and copper (Cu), or alloys thereof. The first driving electrodes TE1, the first detection electrodes RE1, and the first dummy electrodes DE1 are formed in a mesh structure or a net structure so as not to overlap the light emitting areas. Each of the first driving electrodes TE1 and the first detection electrodes RE1 may partially overlap the connection electrode CE in the Z-axis direction.

A second touch insulating layer TINS2 is formed on the first touch insulating layer TINS1 including the first driving electrodes TE1 and the first detection electrodes RE1. The second touch insulating layer TINS2 may serve to planarize a step formed by the first driving electrodes TE1, the first detection electrodes RE1, and the connection electrodes CE. To this end, the second touch insulating layer TINS2 may be formed as an inorganic layer, that is, a silicon nitride layer, a silicon oxynitride layer, a silicon oxide layer, a titanium oxide layer, or an aluminum oxide layer. Alternatively, the second touch insulating layer TINS2 may also be formed as an organic layer made of an acryl resin, an epoxy resin, a phenolic resin, a polyamide resin, a polyimide resin, or the like.

The second driving electrodes TE2, the second detection electrodes RE2, the second dummy electrodes DE2, the contact line TEL of the second driving electrodes TE2, the low potential line GRL, and the connection electrodes CE may be formed on the second touch insulating layer TINS2. The connection electrodes CE may electrically connect the respective first driving electrodes TE1 adjacent to each other on the second touch insulating layer TINS2 with the second touch insulating layer TINS2 interposed therebetween. In addition, the connection electrodes CE may electrically connect the respective first detection electrodes RE1 adjacent to each other.

On the second touch insulating layer TINS2 including the second driving electrodes TE2, the second detection electrode RE2, and the contact line TEL, a third touch insulating layer TINS3 may be further formed as a planarization layer and a protective layer. The third touch insulating layer TINS3 may be formed as an inorganic layer, that is, a silicon nitride layer, a silicon oxynitride layer, a silicon oxide layer, a titanium oxide layer, or an aluminum oxide layer.

The first switching elements TR1, the second switching elements TR2, the third switching elements TR3, and the fourth switching elements TR4 are respectively formed in the touch peripheral area TPA. As an example, the first switching elements TR1 receive the first switching control signal input through the first switching signal line TCL formed in the touch peripheral area TPA through the gate electrode G1 thereof. In addition, the first switching elements TR1 are turned on or off by the first switching control signal to electrically connect or disconnect the second driving electrode TE2 to or from the first driving electrode TE1. To this end, the drain electrode D1 or the source electrode S1 of each of the first switching elements TR1 may extend in a direction of the second driving electrode TE2 through the first signal contact hole ANCT1 and may be electrically connected to the contact line TEL of the second driving electrodes TE2 through a line contact hole CCT1. On the other hand, the source electrode S1 or the drain electrode D1 of each of the first switching elements TR1 may be electrically connected to the touch driving line TL.

Figure 7:
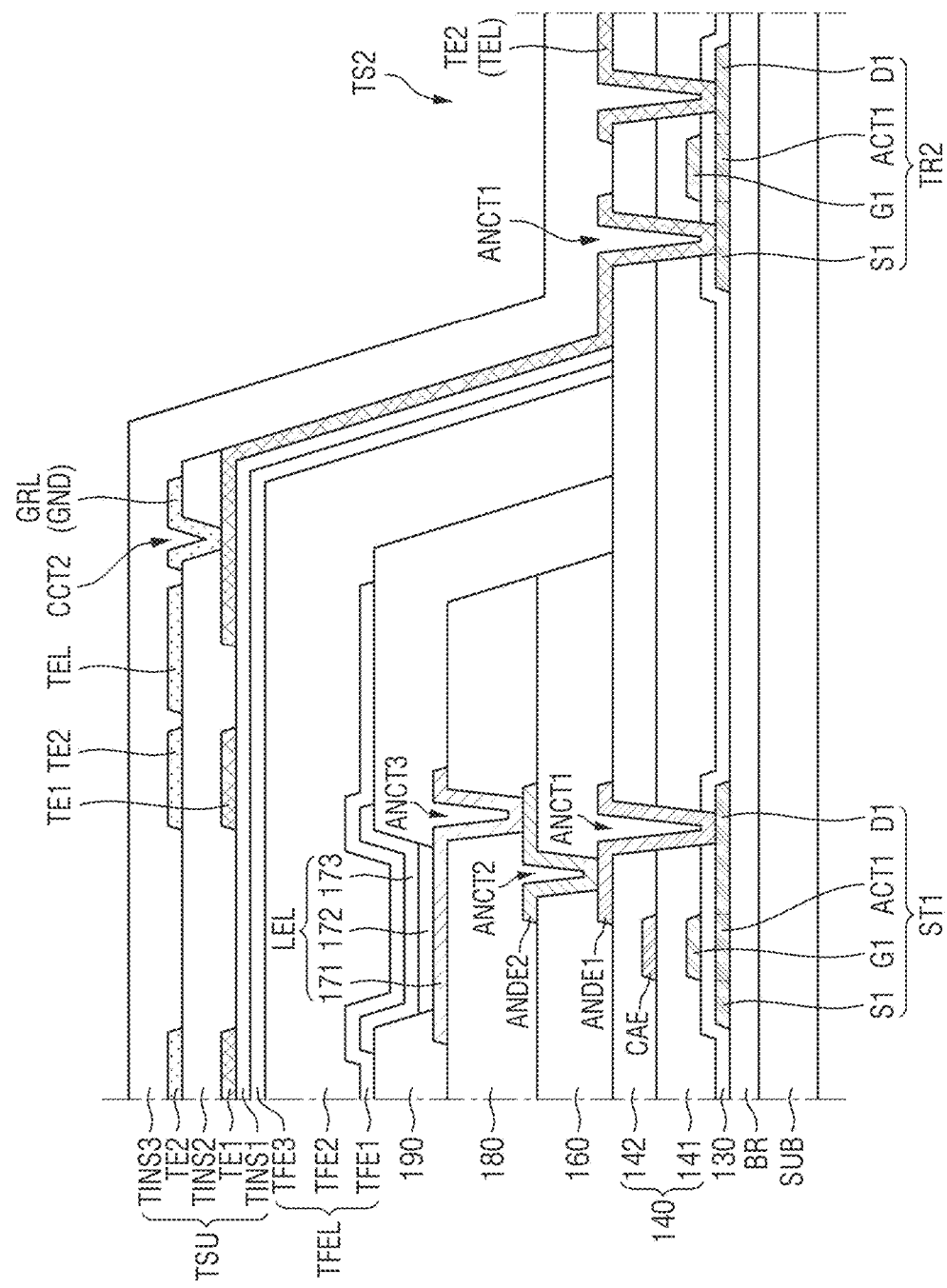
FIG. 7 is a cross-sectional view illustrating a cross-sectional structure of a sub-pixel of a display area, first and second touch detection layers overlapping the display area, and any one of the second switching elements formed in a non-display area according to some embodiments of the present disclosure.

FIG. 7 is a cross-sectional view illustrating a cross-sectional structure of a sub-pixel of a display area, first and second touch detection layers overlapping the display area, and any one of the second switching elements formed in a non-display area.

Referring to FIG. 7, the first switching elements TR1, the second switching elements TR2, the third switching elements TR3, and the fourth switching elements TR4 are respectively formed in the non-display area NDA.

As an example, the second switching elements TR2 receive the second switching control signal input through the second switching signal line TGL formed in the non-display area NDA through the gate electrode G1 thereof. In addition, the second switching elements TR2 are turned on or off by the second switching control signal to electrically connect or disconnect the second driving electrode TE2 to or from the low potential line GRL to which the low potential voltage source GND is applied. To this end, the drain electrode D1 or the source electrode S1 of each of the second switching elements TR2 may extend in a direction of the low potential line GRL through the first signal contact hole ANCT1 and may be electrically connected to the low potential line GRL through a low potential contact hole CCT2. On the other hand, the source electrode S1 or the drain electrode D1 of each of the second switching elements TR2 may be electrically connected to the second driving electrode TE2 or the contact line TEL of the second driving electrodes TE2.

Figure 8:
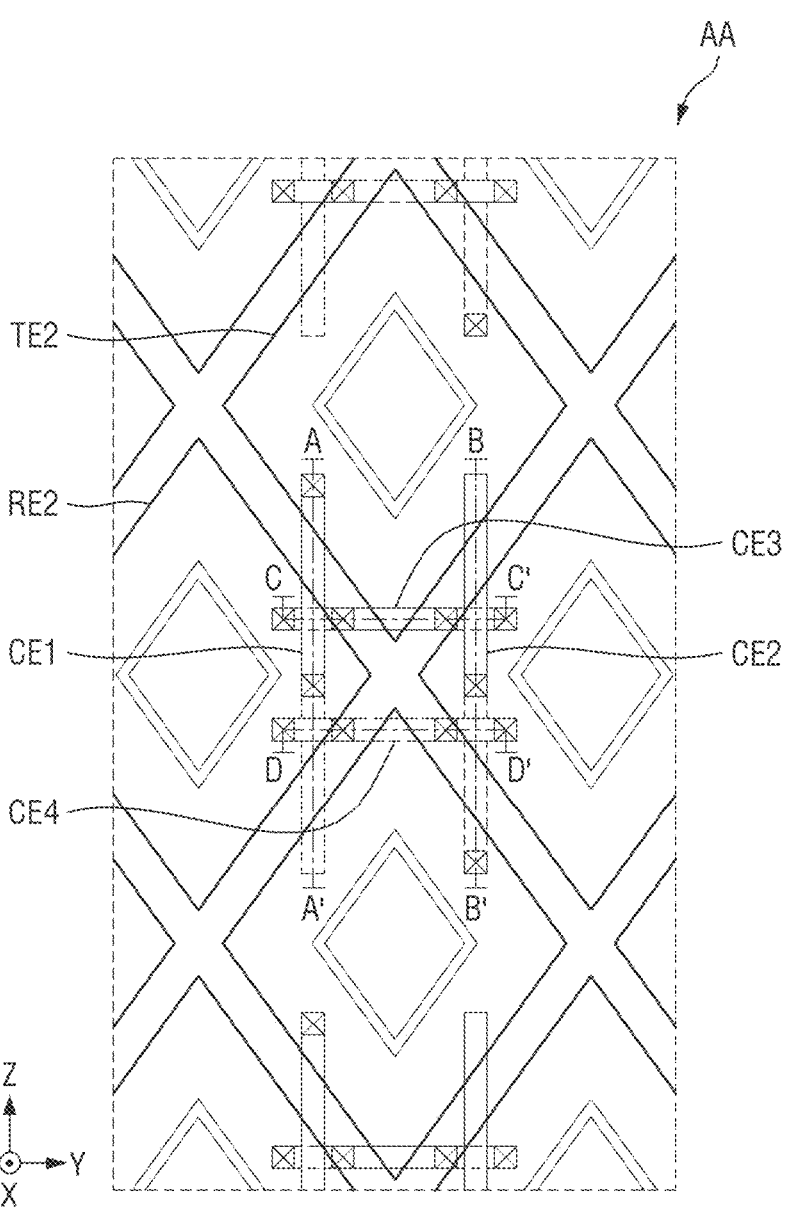
FIG. 8 is an enlarged view specifically illustrating a connection structure of a second driving electrode, a second detection electrode, and connection electrodes located in the area AA of FIG. 4 according to some embodiments of the present disclosure.

FIG. 8 is an enlarged view illustrating an example of a connection structure of a second driving electrode, a second detection electrode, and connection electrodes located in an area AA of FIG. 4.

Referring to FIG. 8, first connection electrodes CE1 electrically connecting the first driving electrodes TE1 adjacent to each other in the Y-axis direction and second connection electrodes CE2 electrically connecting the second driving electrodes TE2 adjacent to each other in the Y-axis direction are located on the first touch detection layer TSA1 and the second touch detection layer TSA2 of the touch sensing unit TSU, respectively.

In addition, third connection electrodes CE3 electrically connecting the first detection electrodes RE1 adjacent to each other in the X-axis direction and fourth connection electrodes CE4 electrically connecting the second detection electrodes RE2 adjacent to each other in the X-axis direction are located on the first touch detection layer TSA1 and the second touch detection layer TSA2, respectively.

The first connection electrodes CE1 may be formed of the same metal material as that of the second driving electrode TE2 when the second driving electrode TE2 is formed, and electrically connect the first driving electrodes TE1 adjacent to each other so that the first driving electrodes TE1 adjacent to each other are not electrically connected to other first detection electrodes RE1 and second driving electrodes TE2. To this end, a plurality of electrode contact holes penetrating through the second touch insulating layer TINS2 may be formed on the front surfaces of the first driving electrodes TE1, and the first connection electrodes CE1 formed of the same metal material as that of the second driving electrode TE2 may connect the first driving electrodes TE1 adjacent to each other through the plurality of electrode contact holes.

The second connection electrodes CE2 may be formed of the same metal material as that of the first driving electrode TE1 when the first driving electrode TE1 is formed, and electrically connect the second driving electrodes TE1 adjacent to each other so that the second driving electrodes TE2 adjacent to each other are not electrically connected to other second detection electrodes RE2 and first driving electrodes TE1. To this end, the second driving electrodes TE2 may be electrically connected to the second connection electrodes CE2 formed of the same metal material of the first driving electrodes TE1 through the plurality of electrode contact holes penetrating through the second touch insulating layer TINS2.

The third connection electrodes CE3 may be formed of the same metal material as that of the second detection electrode RE2 when the second detection electrode RE2 is formed, and electrically connect the first detection electrodes RE1 adjacent to each other so that the first detection electrodes RE1 adjacent to each other are not electrically connected to other second detection electrodes RE2 and first driving electrodes TE1. To this end, a plurality of electrode contact holes penetrating through the second touch insulating layer TINS2 may be formed on the front surfaces of the first detection electrodes RE1, and the third connection electrodes CE3 formed of the same metal material as that of the second detection electrode RE2 may connect the first detection electrodes RE1 adjacent to each other through the plurality of electrode contact holes.

The fourth connection electrodes CE4 may be formed of the same metal material as that of the first detection electrode RE1 when the first detection electrode RE1 is formed, and electrically connect the second detection electrodes RE2 adjacent to each other so that the second detection electrodes RE2 adjacent to each other are not electrically connected to other first detection electrodes RE1 and second driving electrodes TE2. To this end, the second detection electrodes RE2 may be electrically connected to the fourth connection electrodes CE4 formed of the same metal material of the first detection electrodes RE1 through the plurality of electrode contact holes penetrating through the second touch insulating layer TINS2.

Figure 9:
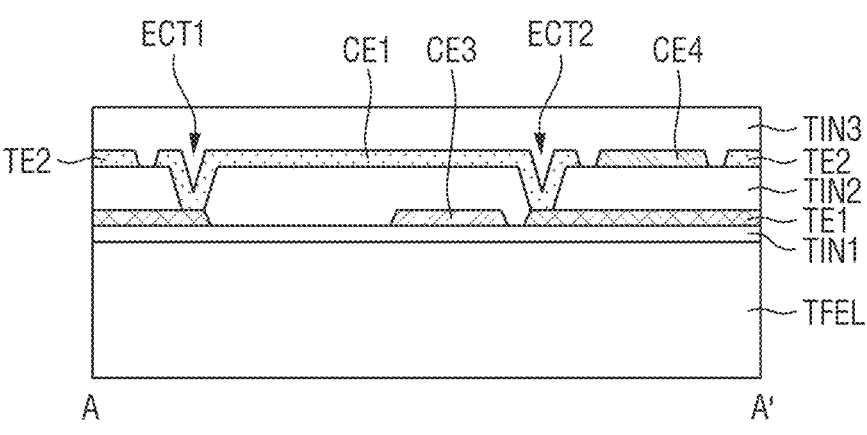
FIG. 9 is a cross-sectional view illustrating further details of a cross section A-A' of FIG. 8 according to some embodiments of the present disclosure.

FIG. 9 is a cross-sectional view illustrating an example of a cross section A-A' of FIG. 8. For example, FIG. 9 is a cross-sectional view illustrating the first connection electrode CE1 electrically connecting the first driving electrodes TE1 adjacent to each other.

Referring to FIG. 9, the first driving electrodes TE1 and the first detection electrodes RE1 may be patterned and formed on the first touch insulating layer TINS1 of the encapsulation film TFEL in the X-axis and Y-axis directions. When the first driving electrodes TE1 and the first detection electrodes RE1 are formed, the second and third connection electrodes CE2 and CE3 may be patterned and formed of the same metal material as that of the first driving electrode TE1 and by the same process as that of the first driving electrode TE1.

The second and third connection electrodes CE2 and CE3 may be respectively formed in formation areas of the second and third connection electrodes CE2 and CE3 that do not overlap the first driving electrode TE1 and the first detection electrodes RE1.

The second touch insulating layer TINS2 is formed on the first touch insulating layer TINS1 including the first driving electrodes TE1, the first detection electrodes RE1, and the second and third connection electrodes CE2 and CE3.

A plurality of first and second electrode contact holes ECT1 and ECT2 penetrating through the second touch insulating layer TINS2 are formed in the arrangement area of the first connection electrodes CE1 overlapping the front direction of the first driving electrodes TE1.

The second driving electrodes TE2 and the second detection electrodes RE2 are formed on the second touch insulating layer TINS2 including the first and second electrode contact holes ECT1 and ECT2 in the X-axis and Y-axis directions. In this case, the first connection electrodes CE1 are patterned and formed in the formation area of the first connection electrodes CE1 using the same metal material as that of the second driving electrode TE2.

The first connection electrodes CE1 may connect the first driving electrodes TE1 adjacent to each other in the Y-axis direction through the plurality of first and second electrode contact holes ECT1 and ECT2.

As such, the first connection electrodes CE1 may be formed of the same metal material as that of the second driving electrode TE2 through the same patterning process as that of the second driving electrode TE2, and may connect the first driving electrodes TE1 adjacent to each other in the Y-axis direction through the plurality of first and second electrode contact holes ECT1 and ECT2 penetrating through the second touch insulating layer TINS2.

Figure 10:
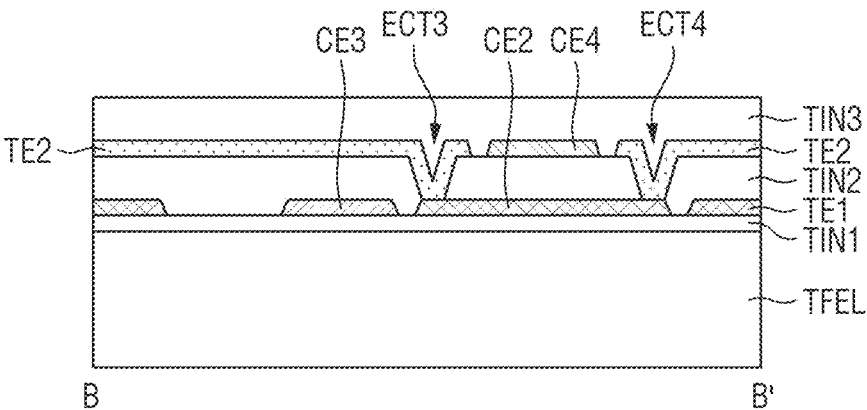
FIG. 10 is a cross-sectional view illustrating further details of a cross section B-B' of FIG. 8 according to some embodiments of the present disclosure.

FIG. 10 is a cross-sectional view illustrating an example of a cross section B-B' of FIG. 8. For example, FIG. 10 is a cross-sectional view illustrating the second connection electrode CE2 electrically connecting the second driving electrodes TE2 adjacent to each other.

Referring to FIG. 10, the first driving electrodes TE1 and the first detection electrodes RE1 may be patterned and formed on the first touch insulating layer TINS1 in the X-axis and Y-axis directions. When the first driving electrodes TE1 and the first detection electrodes RE1 are formed, the second and third connection electrodes CE2 and CE3 may be patterned and formed of the same metal material as that of the first driving electrode TE1 and by the same process as that of the first driving electrode TE1.

The second connection electrodes CE2 may be respectively formed in formation areas of the second connection electrodes CE2 that do not overlap the first driving electrode TE1 and the first detection electrodes RE1.

The second touch insulating layer TINS2 is formed on the first touch insulating layer TINS1 including the first driving electrodes TE1, the first detection electrodes RE1, and the second and third connection electrodes CE2 and CE3.

A plurality of third and fourth electrode contact holes ECT3 and ECT4 penetrating through the second touch insulating layer TINS2 are formed in the arrangement area of the second driving electrodes TE2 overlapping the front direction of the second connection electrodes CE2.

The second driving electrodes TE2 and the second detection electrodes RE2 are patterned and formed on the second touch insulating layer TINS2 including the third and fourth electrode contact holes ECT3 and ECT4 in the X-axis and Y-axis directions. In this case, as the second driving electrodes TE2 are connected to the second connection electrodes CE2 through the plurality of third and fourth electrode contact holes ECT3 and ECT4, the second driving electrodes TE2 are electrically connected to each other in the Y-axis direction through the plurality of third and fourth electrode contact holes ECT3 and ECT4 and the second connection electrodes CE2.

As such, the second connection electrodes CE2 may be formed of the same metal material as that of the first driving electrodes TE1 when the first driving electrode TE1 is formed, and the second driving electrodes TE2 may be electrically connected to the second connection electrodes CE2 through the plurality of third and fourth electrode contact holes ECT3 and ECT4 penetrating through the second touch insulating layer TINS2 and formed on the front surfaces of the second connection electrodes CE2.

Figure 11:
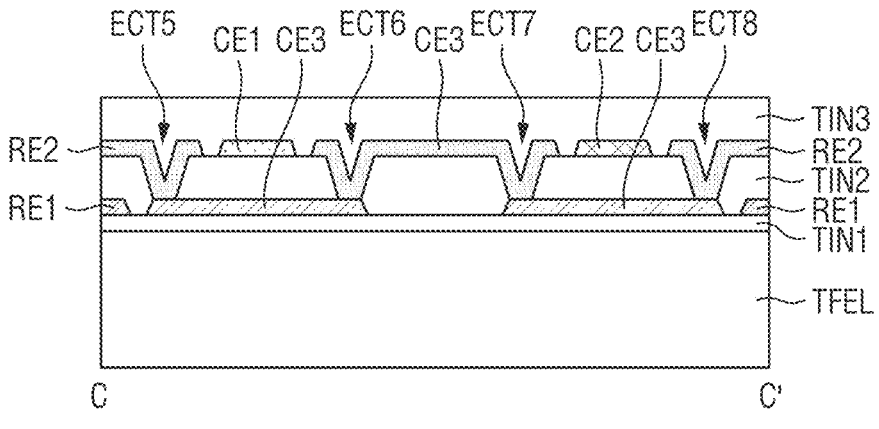
FIG. 11 is a cross-sectional view illustrating further details of a cross section C-C' of FIG. 8 according to some embodiments of the present disclosure.

FIG. 11 is a cross-sectional view illustrating an example of a cross section C-C' of FIG. 8. For example, FIG. 11 is a cross-sectional view illustrating the third connection electrode CE3 electrically connecting the second detection electrodes RE2 adjacent to each other.

Referring to FIG. 11, the first driving electrodes TE1, the first detection electrodes RE1, and the third connection electrodes CE3 may be patterned and formed on the first touch insulating layer TINS1 in the X-axis and Y-axis directions.

For example, when the first driving electrodes TE1 and the first detection electrodes RE1 are formed, the third connection electrodes CE3 may be patterned and formed of the same metal material as that of the first detection electrodes RE1 and by the same process as that of the first detection electrodes RE1. The third connection electrodes CE3 may be respectively formed in formation areas of the third connection electrodes CE3 that do not overlap the first driving electrode TE1 and the first detection electrodes RE1.

The second touch insulating layer TINS2 is formed on the first touch insulating layer TINS1 including the first driving electrodes TE1, the first detection electrodes RE1, and the third connection electrodes CE3.

A plurality of fifth to eighth electrode contact holes ECT5 to ECT8 penetrating through the second touch insulating layer TINS2 are formed in the arrangement area of the second detection electrodes RE2 overlapping the front direction of the third connection electrodes CE3.

The second driving electrodes TE2 and the second detection electrodes RE2 are patterned and formed on the second touch insulating layer TINS2 including the plurality of fifth to eighth electrode contact holes ECT5 to ECT8 in the X-axis and Y-axis directions. In this case, as the second detection electrodes RE2 are connected to the third connection electrodes CE3 through the plurality of fifth to eighth electrode contact holes ECT5 to ECT8, the second detection electrodes RE2 are electrically connected to each other in the X-axis direction through the plurality of fifth to eighth electrode contact holes ECT5 to ECT8 and the third connection electrodes CE3.

As such, the third connection electrodes CE3 may be formed of the same metal material as that of the first detection electrodes RE1 when the first detection electrode RE1 is formed, and the second detection electrodes RE2 may be electrically connected to the third connection electrodes CE3 through the plurality of fifth to eighth electrode contact holes ECT5 to ECT8 penetrating through the second touch insulating layer TINS2 and formed on the front surfaces of the third connection electrodes CE3.

Figure 12:
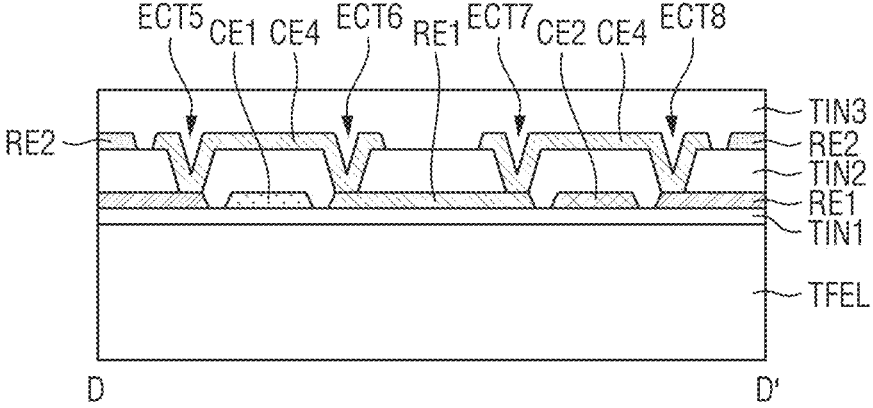
FIG. 12 is a cross-sectional view illustrating further details of a cross section D-D' of FIG. 8 according to some embodiments of the present disclosure.

FIG. 12 is a cross-sectional view illustrating an example of a cross section D-D' of FIG. 8. For example, FIG. 12 is a cross-sectional view illustrating the fourth connection electrode CE4 electrically connecting the first detection electrodes RE1 adjacent to each other.

Referring to FIG. 12, the first driving electrodes TE1 and the first detection electrodes RE1 may be patterned and formed on the first touch insulating layer TINS1 in the X-axis and Y-axis directions. When the first driving electrodes TE1 and the first detection electrodes RE1 are formed, the second and third connection electrodes CE2 and CE3 may be patterned and formed of the same metal material as that of the first driving electrode TE1 and by the same process as that of the first driving electrode TE1.

The second and third connection electrodes CE2 and CE3 may be respectively formed in formation areas of the second and third connection electrodes CE2 and CE3 that do not overlap the first driving electrode TE1 and the first detection electrodes RE1.

The second touch insulating layer TINS2 is formed on the first touch insulating layer TINS1 including the first driving electrodes TE1, the first detection electrodes RE1, and the second and third connection electrodes CE2 and CE3.

A plurality of ninth to twelfth electrode contact holes ECT9 to ECT12 penetrating through the second touch insulating layer TINS2 are formed in the arrangement area of the fourth connection electrodes CE4 overlapping the front direction of the first detection electrodes RE1.

The second driving electrodes TE2 and the second detection electrodes RE2 are patterned and formed on the second touch insulating layer TINS2 including the ninth to twelfth electrode contact holes ECT9 to ECT12 in the X-axis and Y-axis directions. In this case, the fourth connection electrodes CE4 are patterned and formed in the formation area of the fourth connection electrodes CE4 using the same metal material as that of the second detection electrode RE2.

The fourth connection electrodes CE4 may connect the first detection electrodes RE1 adjacent to each other in the X-axis direction through the plurality of ninth to twelfth electrode contact holes ECT9 to ECT12.

As such, the fourth connection electrodes CE4 may be formed of the same metal material as that of the second detection electrode RE2 through the same patterning process as that of the second detection electrode RE2, and may connect the first detection electrodes RE1 adjacent to each other in the X-axis direction through the plurality of ninth to twelfth electrode contact holes ECT9 to ECT12 penetrating through the second touch insulating layer TINS2.

Figure 13:
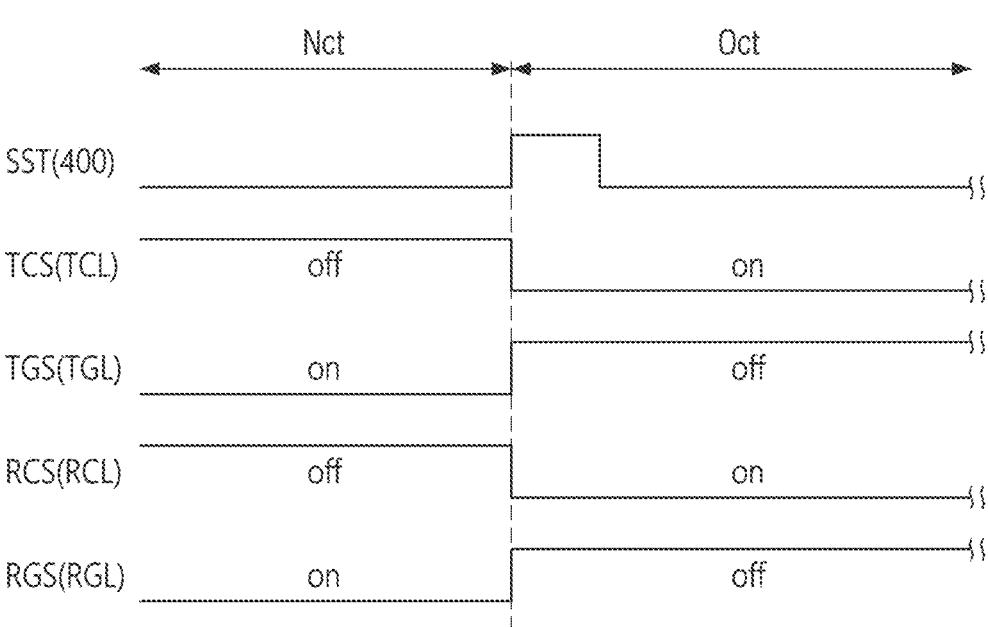
FIG. 13 is a waveform diagram illustrating input/output control signals of a touch driving circuit illustrated in FIGS. 1 and 2 according to some embodiments of the present disclosure.

FIG. 13 is a waveform diagram illustrating input/output control signals of a touch driving circuit illustrated in FIGS. 1 and 2. In addition, FIG. 14 is a circuit diagram illustrating an operation of each of the first and second touch electrodes, driving switching circuits, and detection switching circuits.

First, referring to FIG. 13, the touch driving circuit 400 determines a period in which a proximity detection signal SST is not input from the proximity detection sensing unit 410 as a non-touch detection period Nct in which a touch does not occur. Accordingly, the touch driving circuit 400 supplies a second switching control signal TGS of a turn-on level to the second switching element TR2 of the second driving switching circuits TS2 through the second switching signal lines TGL during the non-touch detection period Nct. In addition, the touch driving circuit 400 supplies a fourth switching control signal RGS of a turn-on level to the fourth switching element TR4 of the second detection switching circuits RS2.

Meanwhile, the touch driving circuit 400 supplies a first switching control signal TCS of a turn-off level to the first switching element TR1 of the first driving switching circuits TS1 through the first switching signal lines TCL during the non-touch detection period Nct. In addition, the touch driving circuit 400 supplies a third switching control signal RCS of a turn-off level to the third switching element TR3 of the first detection switching circuits RS1.

Figure 14:
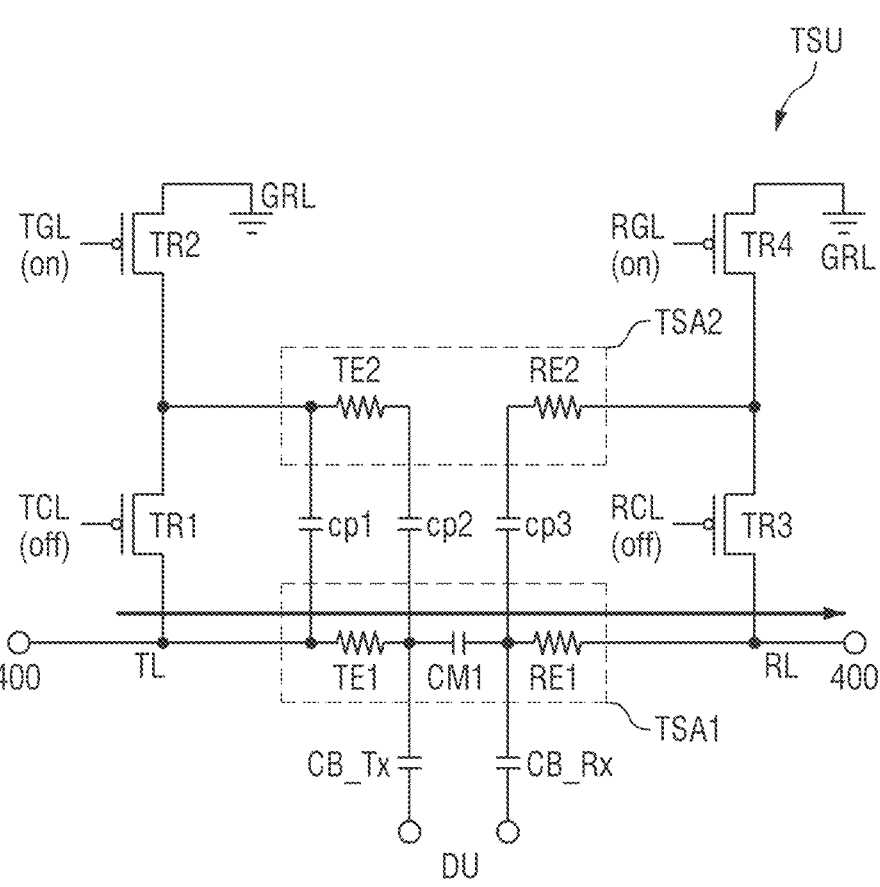
FIG. 14 is a circuit diagram illustrating an operation of each of the first and second touch electrodes, driving switching circuits, and detection switching circuits according to some embodiments of the present disclosure.

Referring to FIG. 14, during the non-touch detection period Nct, the second switching element TR2 of the second driving switching circuits TS2 are turned on by the second switching control signal TGS to electrically the second driving electrode TE2 to the low potential line GRL to which the low potential voltage source GND is applied. In addition, the fourth switching element TR4 of the second detection switching circuits RS2 is turned on by the fourth switching control signal RGS to electrically connect the second detection electrode RE2 to the low potential line GRL to which the low potential voltage source GND is applied. Accordingly, during the non-touch detection period Nct, the second driving electrodes TE2 and the second detection electrodes RE2 may be connected to the low potential voltage source GND to reduce the amount of EMI radiation.

Meanwhile, during the non-touch detection period Nct, the first switching element TR1 of the first driving switching circuits TS1 is turned off by the first switching control signal TCS to electrically disconnect the second driving electrode TE2 from the first driving electrode TE1. In addition, the third switching element TR3 of the first detection switching circuits RS1 is turned off by the third switching control signal RCS to electrically disconnect the second detection electrode RE2 from the first detection electrode RE1. Therefore, as illustrated in FIG. 14, the touch driving signal may flow only through the first driving electrodes TE1 and the first detection electrodes RE1 of the first touch detection layer TSA1 during the non-touch detection period Nct.

Referring to FIG. 13, when the proximity detection signal SST is input from the proximity detection sensing unit 410, the touch driving circuit 400 may determine that the user's touch occurs. Accordingly, the touch driving circuit 400 supplies a second switching control signal TGS of a turn-off level to the second switching element TR2 of the second driving switching circuits TS2 during a touch detection period Oct. In addition, the touch driving circuit 400 supplies a fourth switching control signal RGS of a turn-off level to the fourth switching element TR4 of the second detection switching circuits RS2.

Meanwhile, the touch driving circuit 400 supplies the first switching control signal TCS of the turn-on level to the first switching element TR1 of the first driving switching circuits TS1 during a touch occurrence period in which the proximity detection signal SST is input from the proximity detection sensing unit 410 at an enable level (e.g., a rising level). In addition, the touch driving circuit 400 supplies a third switching control signal RCS of a turn-on level to the third switching element TR3 of the first detection switching circuits RS1.

Figure 15:
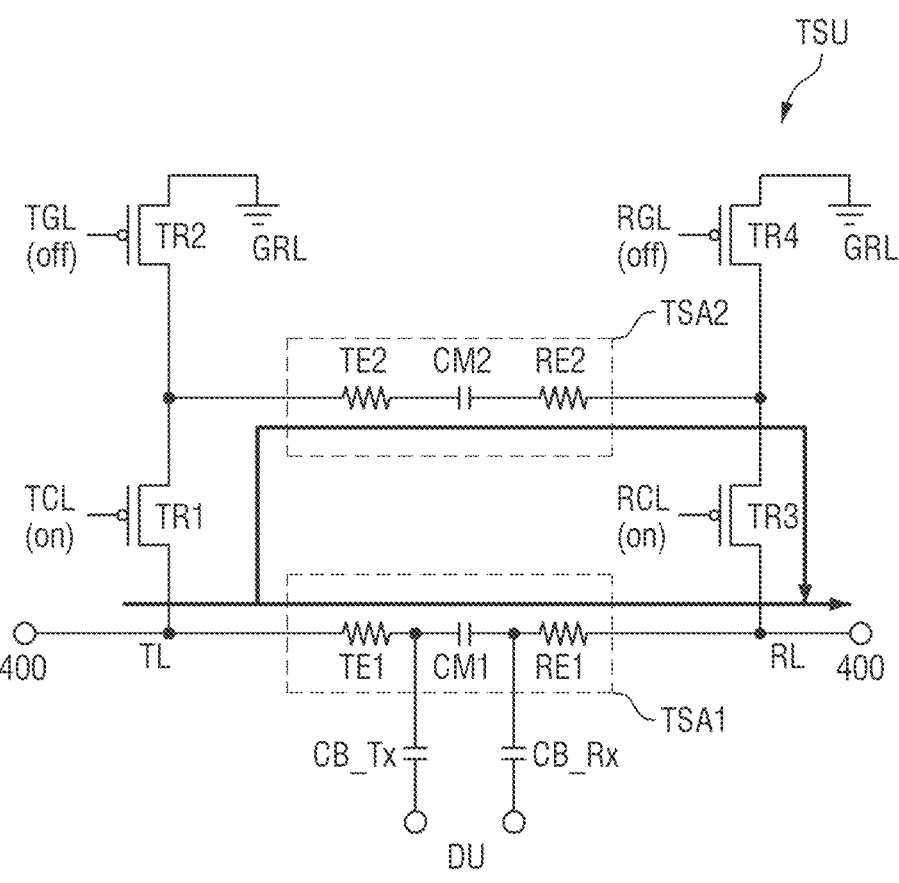
FIG. 15 is another circuit diagram illustrating operations of the first and second touch electrodes, the driving switching circuits, and the detection switching circuits illustrated in FIG. 14 according to some embodiments of the present disclosure.

FIG. 15 is another circuit diagram illustrating operations of the first and second touch electrodes, the driving switching circuits, and the detection switching circuits illustrated in FIG. 14.

Referring to FIG. 15, during the touch detection period Oct, the second switching element TR2 is turned off by the second switching control signal TGS to electrically disconnect the second driving electrode TE2 from the low potential line GRL. In addition, the fourth switching element TR4 is turned off by the fourth switching control signal RGS to electrically disconnect the second detection electrode RE2 from the low potential line GRL.

Meanwhile, during the touch detection period Oct, the first switching element TR1 of the first driving switching circuits TS1 is turned on by the first switching control signal TCS to electrically connect the second driving electrode TE2 to the first driving electrode TE1. In addition, the third switching element TR3 of the first detection switching circuits RS1 is turned on by the third switching control signal RCS to electrically connect the second detection electrode RE2 to the first detection electrode RE1. Therefore, as illustrated by an arrow of FIG. 15, during the touch detection period Oct, the first touch electrode SEN1 and the second touch electrode SEN2 may be connected in a parallel structure to detect a touch of a touch input device or a user's body portion.

Figure 16:
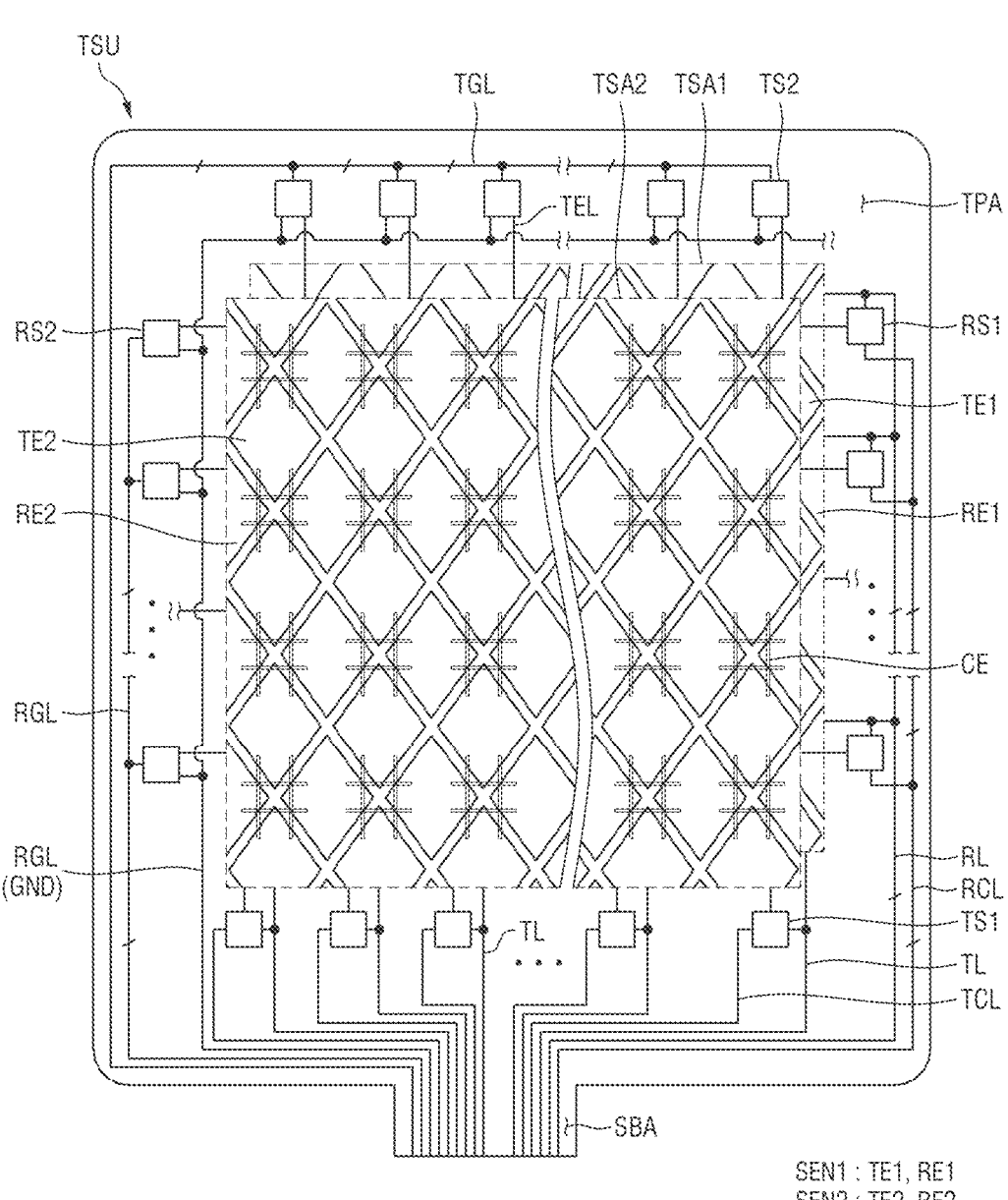
FIG. 16 is a layout view schematically illustrating a touch detection module according to some embodiments of the present disclosure.

FIG. 16 is a layout view schematically illustrating a touch detection module according to some embodiments.

Referring to FIG. 16 together with FIG. 4, in the main area MA, the first touch electrodes SEN1 and the second touch electrodes SEN2 may be located in the main area MA to overlap each other to correspond to each other as a double layer with the touch insulating layer interposed therebetween.

For example, the two types of first driving electrodes TE1 and first detection electrodes RE1 constituting the first touch electrodes SEN1 may be formed as conductive metal electrodes made of any one of molybdenum (Mo), aluminum (AI), chromium (Cr), gold (Au), titanium (Ti), nickel (Ni), neodymium (Nd), and copper (Cu), or alloys thereof.

Unlike this, the two types of second driving electrodes TE2 and second detection electrodes RE2 constituting the second touch electrodes SEN2 may be formed of a transparent metal material such as indium tin oxide (ITO). When the second driving electrodes TE2 and the second detection electrodes RE2 are formed of the transparent metal material, the second driving electrodes TE2 and the second detection electrodes RE2 may be formed in a polygonal planar shape without forming separate second dummy electrodes DE2 and transmission holes.

Figure 17:
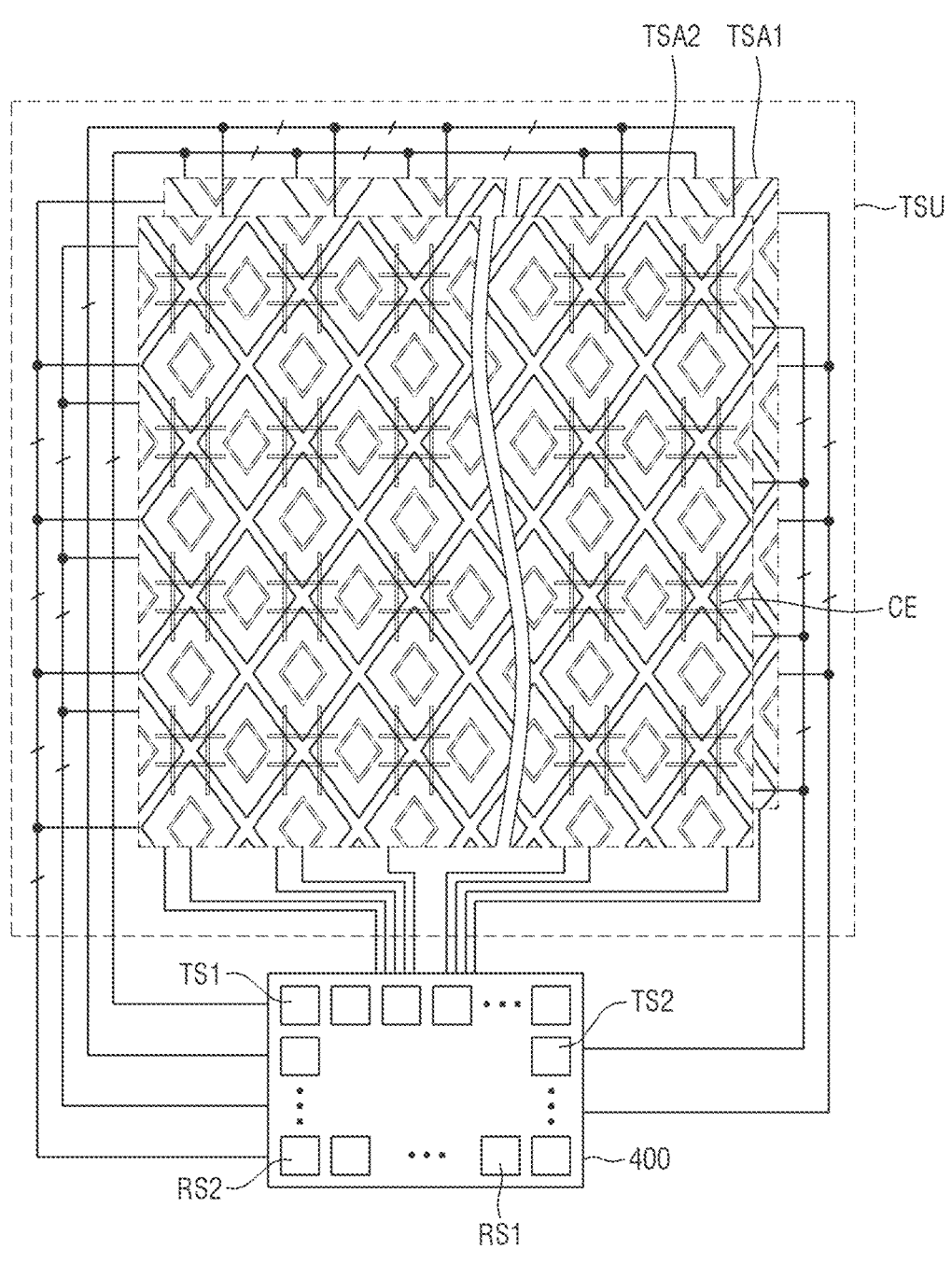
FIG. 17 is a layout view schematically illustrating a touch detection module according to some embodiments of the present disclosure.

FIG. 17 is a layout view schematically illustrating a touch detection module according to some embodiments.

Referring to FIG. 17, at least one switching circuit of the first driving switching circuits TS1 including the first switching element TR1, the second driving switching circuits TS2 including the second switching element TR2, the first detection switching circuits RS1 including the third switching element TR3, and the second detection switching circuits RS2 including the fourth switching element TR4 may be integrally integrated to form an integrated circuit.

Unlike this, at least one switching circuit of the first driving switching circuits TS1, the second driving switching circuits TS2, the first detection switching circuits RS1, and the second detection switching circuit RS2 may be formed integrally with the touch driving circuit 400 in the form of an integrated circuit.

Meanwhile, at least one switching circuit of the first driving switching circuits TS1, the second driving switching circuits TS2, the first detection switching circuits RS1, and the second detection switching circuit RS2 may be formed integrally with the display driving circuit 200 in the form of an integrated circuit.

The Meanwhile, at least one switching circuit of the integrated first driving switching circuits TS1, second driving switching circuits TS2, first detection switching circuits RS1, and second detection switching circuit RS2 may be located in the non-display area NDA of the display panel 100 or the circuit board 300.

Figure 18:
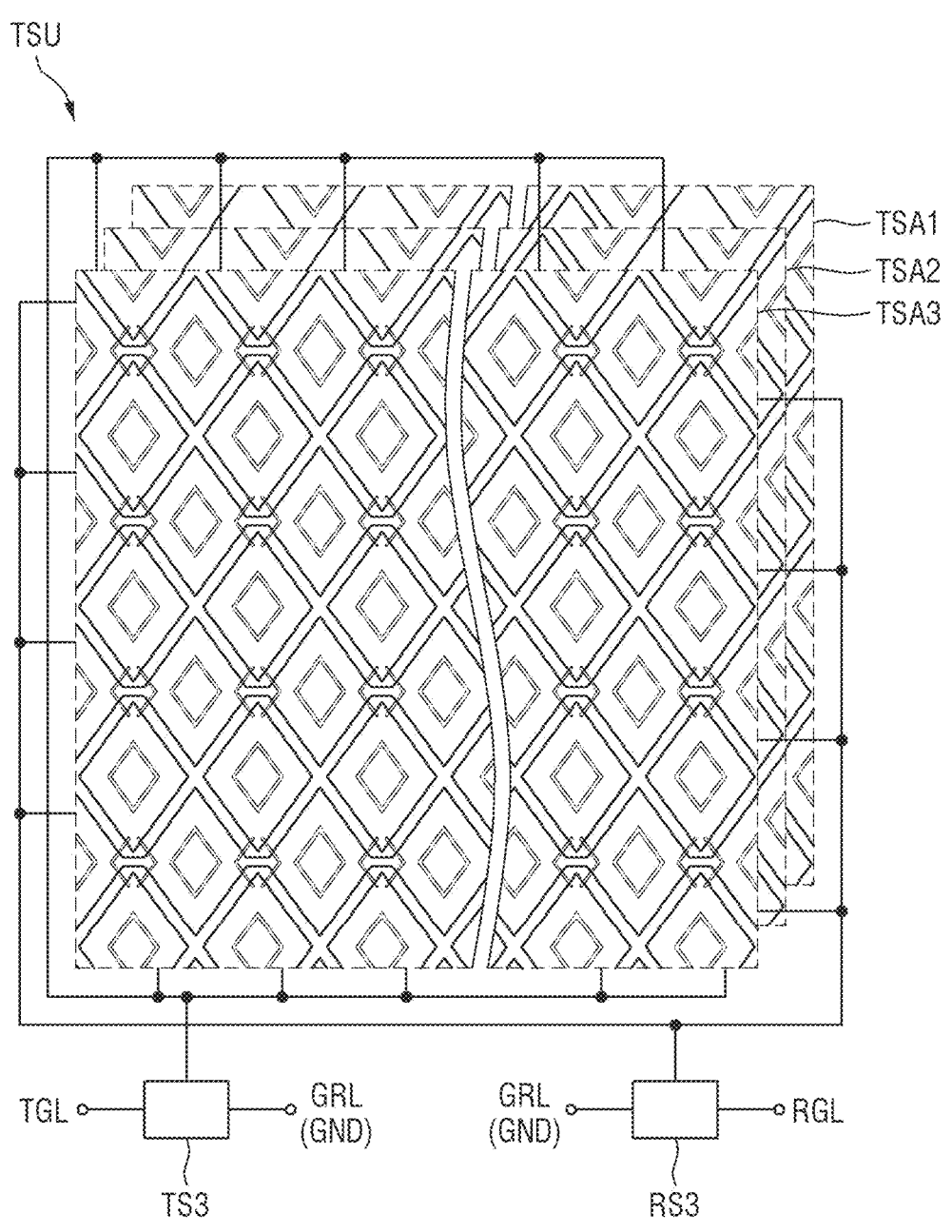
FIG. 18 is a layout view schematically illustrating another example of the touch detection module according to some embodiments of the present disclosure.

FIG. 18 is a layout view schematically illustrating another example of the touch detection module according to some embodiments.

Referring to FIG. 18, the second touch detection layer TSA2 on which the second touch electrodes SEN2 for reducing the amount of EMI radiation or detection the user's touch are located may be located on the front surface of the first touch detection layer TSA1 corresponding to the first touch detection layer TSA1 on which the first touch electrodes SEN1 for detecting the user's touch are located, and a floating electrode layer TSA3 for controlling the amount of EMI radiation may be further formed on the front surface of the second touch detection layer TSA2.

The arrangement structure of the first and second touch electrodes SEN1 and SEN2 located on the first touch detection layer TSA1 and the second touch detection layer TSA2 will be replaced with the detailed description with reference to FIG. 4.

A rhombus or a quadrangle other than a rhombus, a polygon other than a quadrangle, a circle, or an elliptical planar floating electrode may be formed in a plurality or a single plate shape on the floating electrode layer TSA3 located on the front surface of the second touch detection layer TSA2.

The touch detection module may further include a third driving switching circuit TS3 and a third detection switching circuit RS3 that electrically connect or disconnect at least one planar floating electrode located on the floating electrode layer TSA3 to or from the low potential line GRL to which the low potential voltage source GND is applied, in response to the second or fourth switching control signal TGS or RGS from the touch driving circuit 400.

Figure 19:
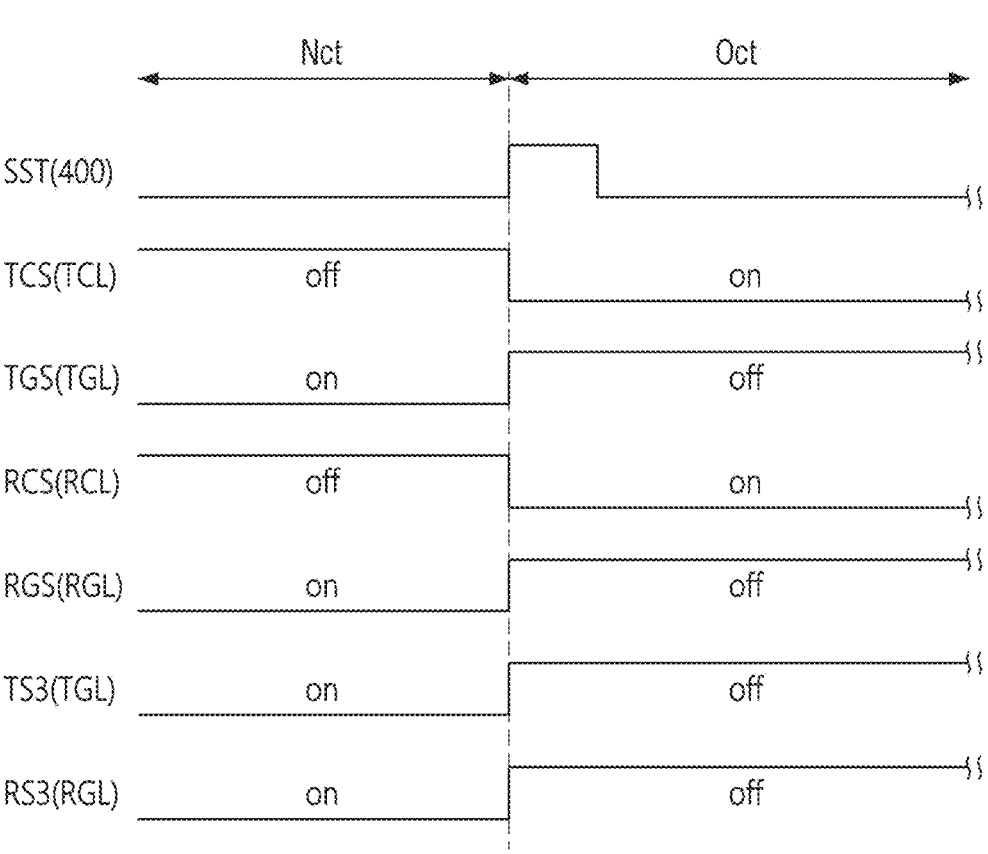
FIG. 19 is a waveform diagram illustrating further details of the input/output control signals of the touch driving circuit illustrated in FIGS. 1 and 2 according to some embodiments of the present disclosure.

FIG. 19 is another waveform diagram illustrating the input/output control signals of the touch driving circuit illustrated in FIGS. 1 and 2.

Referring to FIG. 19, the third driving switching circuit TS3 is turned on by the second switching control signal TGS during the non-touch detection period Nct to electrically connect at least one planar floating electrode located on the floating electrode layer TSA3 to the low potential line GRL to which the low potential voltage source GND is applied.

Similarly, the third driving switching circuit TS3 may be turned on by the fourth switching control signal RGS during the non-touch detection period Nct to electrically connect at least one planar floating electrode located on the floating electrode layer TSA3 to the low potential line GRL to which the low potential voltage source GND is applied.

At least one flat floating electrode located on the floating electrode layer TSA3 may be connected to the low potential voltage source GND during the non-touch detection period Nct to reduce the amount of EMI radiation.

Meanwhile, the third driving switching circuit TS3 is turned off by the second switching control signal during the touch detection period Oct to disconnect at least one planar floating electrode located on the floating electrode layer TSA3 from the low potential line GRL so that the planar floating electrode is in a floating state.

Similarly, the third detection switching circuit RS3 is turned off by the fourth switching control signal during the touch detection period Oct to disconnect at least one planar floating electrode located on the floating electrode layer TSA3 from the low potential line GRL so that the planar floating electrode is in a floating state. Accordingly, during the touch detection period Oct, the first touch electrode SEN1 and the second touch electrode SEN2 may be connected in a parallel structure to detect a touch of a touch input device or a user's body portion.

Figure 20:
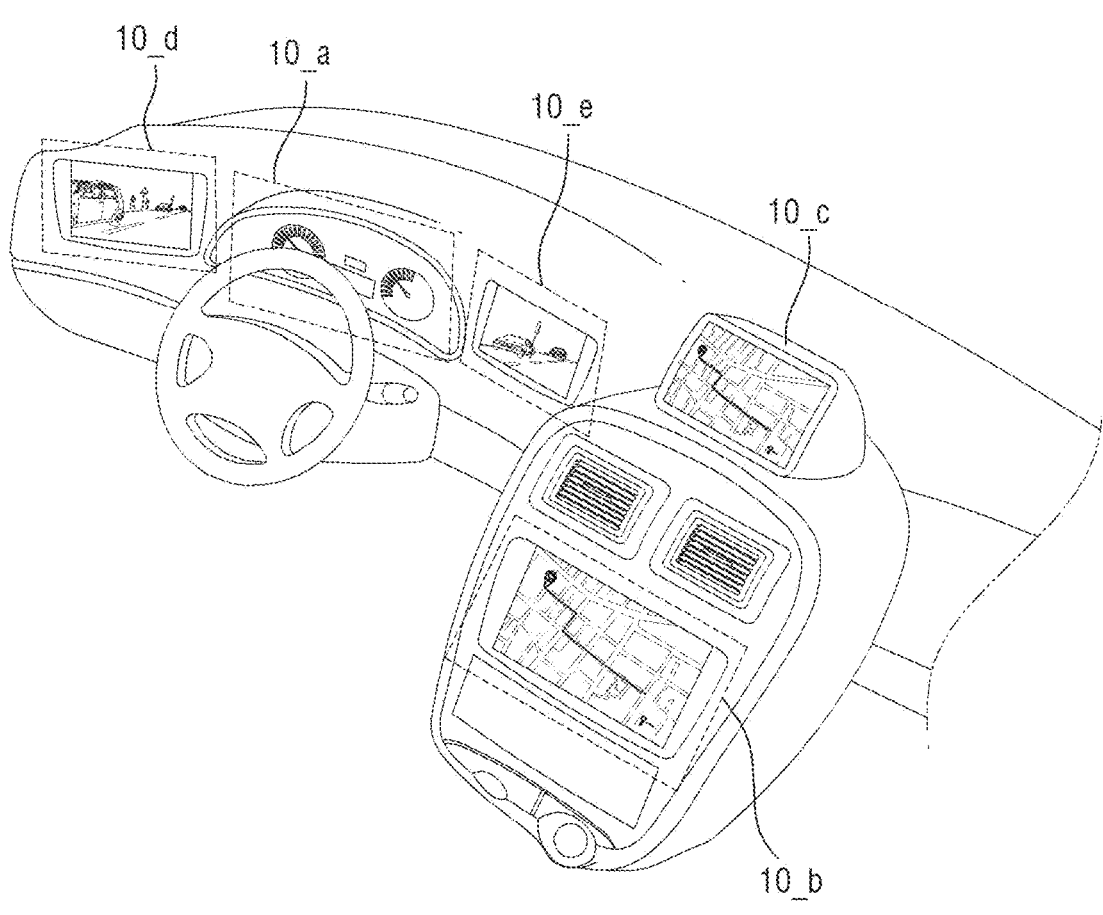
FIG. 20 is an illustrative view illustrating an instrument board and a center fascia of a vehicle including the display device according to some embodiments of the present disclosure.

FIG. 20 is an illustrative view illustrating an instrument board and a center fascia of a vehicle including the display device according to some embodiments.

Referring to FIG. 20, a vehicle to which display devices 10_a, 10_b, 10_c, 10_d, and 10_e for a vehicle according to some embodiments are applied is illustrated in FIG. 20. A first display device 10_a for a vehicle according to some embodiments may be applied to an instrument panel of a vehicle, or a second display device 10_b for a vehicle according to some embodiments may be applied to a center fascia of a vehicle. In addition, a third display device 10_c for a vehicle according to some embodiments may be applied to a center information display (CID) located on a dashboard of the vehicle. Meanwhile, fourth and fifth display devices 10_d and 10_e for a vehicle according to some embodiments may be applied to a room mirror display instead of a side mirror of the vehicle.

In concluding the detailed description, those skilled in the art will appreciate that many variations and modifications can be made to the example embodiments without substantially departing from the principles of the present invention. Therefore, the disclosed example embodiments of the invention are used in a generic and descriptive sense only and not for purposes of limitation.

What is claimed is:

1. A display device comprising:
a display panel including a display area in which sub-pixels are arranged;
a touch detection module on a front surface of the display panel to detect a touch of a user,
wherein the touch detection module comprises:
first driving electrodes arranged side by side;
first detection electrodes crossing the first driving electrodes;
second driving electrodes on front surfaces of the first driving electrodes to correspond to the first driving electrodes with a touch insulating layer interposed therebetween;
second detection electrodes on front surfaces of the first detection electrodes to correspond to the first detection electrodes with the touch insulating layer interposed therebetween;
driving switching circuits electrically connecting the second driving electrodes to the respective first driving electrodes corresponding to each other or a low potential voltage source;
detecting switching circuits configured to electrically connect the second detection electrodes to the respective first detection electrodes corresponding to each other or the low potential voltage source; and a touch driving circuit configured to supply touch driving signals to the first driving electrodes and to detect touch detection signals through the first detection electrodes to detect touch position coordinates.

2. The display device of claim 1, further comprising a proximity detection sensor including at least one sensor of at least one ultrasonic sensor, at least one infrared sensor, at least one motion detection sensor, and a light emitting and light receiving sensor, and configured to detect a touch input device or a body portion of a user that is close to the at least one sensor, and configured to supply a proximity detection signal to the touch driving circuit according to a detection result.

3. The display device of claim 1, wherein the driving switching circuits include:
first driving switching circuits configured to electrically connect or disconnect the second driving electrodes to or from the respective first driving electrodes corresponding to each other in response to a first switching control signal from the touch driving circuit; and
second driving switching circuits configured to electrically connect or disconnect the second driving electrodes to or from the low potential voltage source in response to a second switching control signal from the touch driving circuit.

4. The display device of claim 3, wherein the detection switching circuits include:
first detection switching circuits configured to electrically connect or disconnect the second detection electrodes to or from the respective first detection electrodes corresponding to each other in response to a third switching control signal from the touch driving circuit; and
second detection switching circuits configured to electrically connect or disconnect the second detection electrodes to or from the low potential voltage source in response to a fourth switching control signal from the touch driving circuit.

5. The display device of claim 4, wherein the first driving switching circuits include at least one first switching element configured to electrically connect or disconnect at least one second driving electrode to or from at least one first driving electrode, respectively, in response to the first switching control signal input through a first switching signal line, and
the second driving switching circuits include at least one second switching element configured to electrically connect or disconnect the at least one second driving electrode to or from the low potential voltage source, in response to the second switching control signal input through a second switching signal line.

6. The display device of claim 5, wherein the first detection switching circuits include at least one third switching element configured to electrically connect or disconnect at least one second detection electrode to or from a touch detection line or at least one first detection electrode, in response to the third switching control signal input through a third switching signal line, and
the second detection switching circuits include at least one fourth switching element configured to electrically connect or disconnect the at least one second detection electrode to or from the low potential voltage source, in response to the fourth switching control signal input through a fourth switching signal line.

7. The display device of claim 4, wherein the touch driving circuit is configured to determine a period in which a proximity detection signal is not input from a proximity detection sensor as a non-touch detection period in which a touch does not occur, and during the non-touch detection period, the touch driving circuit is configured to:

supply a second switching control signal of a turn-on level to a second driving switching circuit from among the second driving switching circuits and supply a fourth switching control signal of a turn-on level to a second detection switching circuit from among the second detection switching circuits, and supply a first switching control signal of a turn-off level to the first driving switching circuits and supply a third switching control signal of a turn-off level to the first detection switching circuits.

8. The display device of claim 4, wherein the touch driving circuit is configured to determine that a touch occurs based on a proximity detection signal being input from a proximity detection sensor, and during a touch detection period, the touch driving circuit is configured to:

supply a second switching control signal of a turn-off level to a second driving switching circuit from among the second driving switching circuits and supply a fourth switching control signal of a turn-off level to a second detection switching circuit from among the second detection switching circuits, and supply a first switching control signal of a turn-on level to the first driving switching circuits and supply a third switching control signal of a turn-on level to the first detection switching circuits.

9. The display device of claim 1, further comprising:

first connection electrodes electrically connecting the first driving electrodes adjacent to each other in a first axial direction;

second connection electrodes electrically connecting the second driving electrodes adjacent to each other in the first axial direction;

third connection electrodes electrically connecting the first detection electrodes adjacent to each other in a second axial direction crossing the first axial direction; and fourth connection electrodes electrically connecting the second detection electrodes adjacent to each other in the second axial direction.

10. The display device of claim 9, wherein the first connection electrodes are formed of a same metal material as the second driving electrodes through the same patterning process as that of the second driving electrodes, and are configured to connect the first driving electrodes adjacent to each other in the first axial direction through a plurality of first and second electrode contact holes penetrating through the touch insulating layer, the second connection electrodes are formed of a same metal material as the first driving electrodes when the first driving electrodes are formed, and the second driving electrodes are electrically connected to the second connection electrodes through a plurality of third and fourth electrode contact holes penetrating through the touch insulating layer and formed on front surfaces of the second connection electrodes.

11. The display device of claim 10, wherein the third connection electrodes are formed of a same metal material as the first detection electrodes when the first detection electrodes are formed, the second detection electrodes are electrically connected to the third connection electrodes through a plurality of fifth to eighth electrode contact holes penetrating through the touch insulating layer and formed on front surfaces of the third connection electrodes, and the fourth connection electrodes are formed of a same metal material as the second detection electrodes through a same process as that of the second detection electrodes, and are configured to connect the first detection electrodes adjacent to each other through a plurality of ninth to twelfth electrode contact holes penetrating through the touch insulating layer.

12. The display device of claim 1, wherein the first driving electrodes and the first detection electrodes are formed of an opaque conductive alloy, and the second driving electrodes and the second detection electrodes are formed of a transparent metal material including indium tin oxide (ITO).

13. The display device of claim 1, wherein the driving switching circuits, the detection switching circuits, and the touch driving circuit are integrally integrated to form an integrated circuit, and are on a circuit film or circuit board separately from the first and second driving electrodes.

14. The display device of claim 1, further comprising:

a floating electrode layer on front surfaces of the second driving electrodes and the second detection electrodes with at least one insulating layer interposed therebetween; and a third driving switching circuit configured to electrically connect or disconnect and float at least one planar floating electrode on the floating electrode layer to or from a low potential line to which the low potential voltage source is applied, according to a switching control signal from the touch driving circuit.

15. The display device of claim 1, wherein the display device further comprising:

a display driving circuit configured to control driving of the display panel;

a circuit board on which the display driving circuit is mounted; and a proximity detection sensor configured to detect proximity of a user to generate a proximity detection signal.

* * * * *